US012740194B2

(12) United States Patent
No et al.

(10) Patent No.: US 12,740,194 B2
(45) Date of Patent: Sep. 15, 2026

(54) DISPLAY DEVICE HAVING BANK LAYER AND METHOD OF FABRICATING THE SAME

(71) Applicant: Samsung Display Co., LTD., Yongin-si (KR)

(72) Inventors: Sang Yong No, Seoul (KR); No Kyung Park, Hwaseong-si (KR); Dong Hee Shin, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 923 days.

(21) Appl. No.: 17/994,651

(22) Filed: Nov. 28, 2022

(65) Prior Publication Data

US 2023/0282774 A1 Sep. 7, 2023

(30) Foreign Application Priority Data

Mar. 7, 2022 (KR) ........................ 10-2022-0029017

(51) Int. Cl.
*H10H 20/831* (2025.01)
*H10H 20/85* (2025.01)
*H10W 90/00* (2026.01)
*H10H 20/01* (2025.01)

(52) U.S. Cl.
CPC ...... *H10H 20/831* (2025.01); *H10H 20/8506* (2025.01); *H10W 90/00* (2026.01); *H10H 20/032* (2025.01)

(58) Field of Classification Search
CPC ..... H10H 20/819; H10H 20/83; H10K 59/122
See application file for complete search history.

(56) References Cited

U.S. PATENT DOCUMENTS 8,772,762 B2 * 7/2014 Kaneta .............. H10K 59/8051 313/506
11,302,747 B2 4/2022 Heo et al.
11,749,709 B2 9/2023 Heo et al.
12,068,435 B2 8/2024 Shin et al.
2008/0063949 A1 3/2008 Inoue
(Continued)

FOREIGN PATENT DOCUMENTS

JP 2009238456 A * 10/2009
KR 10-2016-0094588 8/2016
(Continued)

*Primary Examiner* — Ismail A Muse

(74) *Attorney, Agent, or Firm* — Womble Bond Dickinson (US) LLP

(57) ABSTRACT

A display device includes a bank layer including a first bank portion and a second bank portion, the first bank portion includes a (1-1) bank portion and at least one (1-2) bank portion having an average height less than the (1-1) bank portion, the second bank portion includes a (2-1) bank portion, at least one (2-2) bank portion and having an average height less than the (2-1) bank portion, and at least one (2-3) bank portion with the (2-2) bank portion therebetween and having an average height less than the (2-2) bank portion, the (1-1) bank portion exposes an upper end of a side surface of the (1-2) bank portion, the (2-1) bank portion exposes an upper end of a side surface of the (2-2) bank portion, and the (2-2) bank portion exposes an upper end of a side surface of the (2-3) bank portion.

20 Claims, 29 Drawing Sheets

(56) References Cited

U.S. PATENT DOCUMENTS

| | | | | |
|---|---|---|---|---|
| 2012/0313123 | A1* | 12/2012 | Kim | H10K 59/8723 257/89 |
| 2013/0341603 | A1* | 12/2013 | Matsuo | H10K 59/122 438/35 |
| 2016/0172423 | A1* | 6/2016 | Nendai | H10K 71/135 257/40 |
| 2020/0075667 | A1* | 3/2020 | Lee | H10H 20/83 |
| 2024/0379909 | A1 | 11/2024 | Shin et al. | |

FOREIGN PATENT DOCUMENTS

| | | |
|---|---|---|
| KR | 10-2016-0119351 | 10/2016 |
| KR | 10-2021-0065238 | 6/2021 |
| KR | 10-2021-0065239 A | 6/2021 |
| KR | 10-2022-0026626 A | 3/2022 |

* cited by examiner

BNL: BNL1, BNL2, BNL3
RME: RME1, RME2
CNE: CNE1, CNE2, CNE3
ED: ED1, ED2

BNL1: BNL1a, BNL1b

DISPLAY DEVICE HAVING BANK LAYER AND METHOD OF FABRICATING THE SAME

CROSS-REFERENCE TO RELATED APPLICATION(S)

This application claims priority to and benefits of Korean Patent Application No. 10-2022-0029017 under 35 U.S.C. § 119 filed on Mar. 7, 2022 in the Korean Intellectual Property Office, the entire contents of which are incorporated herein by reference.

BACKGROUND

1. Technical Field

The disclosure relates to a display device and a method of fabricating the same.

2. Description of the Related Art

Display devices become more and more important as multimedia technology evolves. Accordingly, a variety of types of display devices such as organic light-emitting display (OLED) devices and liquid-crystal display (LCD) devices are currently used.

As a display device for displaying images, there is a self-luminous display device including light-emitting elements. Examples of such a self-luminous display device may include an organic light-emitting display device using an organic material as the light-emitting material for the light-emitting elements, or an inorganic light-emitting display device using an inorganic material as the light-emitting material for the light-emitting elements.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Aspects of the disclosure provide a display device that can prevent disconnection of connection electrodes and increase the loading amount of an ink.

Aspects of the disclosure also provide a method of fabricating a display device that can prevent disconnection of connection electrodes and increase the loading amount of an ink.

It should be noted that objects of the disclosure are not limited to the above-mentioned objects and other objects of the disclosure will be apparent to those skilled in the art from the following descriptions.

According to an embodiment a display device may include sub-pixels; a first electrode disposed in each of the sub-pixels on a substrate and extended in a first direction; a second electrode spaced apart from the first electrode on the substrate in a second direction intersecting the first direction and extended in the first direction; a bank layer extended in the first direction and the second direction on the first electrode and the second electrode and surrounding the sub-pixels; light-emitting elements disposed on the first electrode and the second electrode; a first connection electrode disposed on the first electrode and extended in the first direction, and a second connection electrode disposed on the second electrode, extended in the first direction and spaced apart from the first connection electrode in the second direction, wherein the bank layer comprises a first bank portion extended in the second direction, and a second bank portion extended in the first direction, the first bank portion comprises a (1-1) bank portion and at least one (1-2) bank portion connected to the (1-1) bank portion in the first direction and having an average height less than an average height of the (1-1) bank portion, the second bank portion comprises a (2-1) bank portion, at least one (2-2) bank portion connected to the (2-1) bank portion in the second direction and having an average height less than an average height of the (2-1) bank portion, and at least one (2-3) bank portion spaced apart from the (2-1) bank portion with the (2-2) bank portion disposed between the (2-1) bank portion and having an average height less than an average height of the (2-2) bank portion, the (1-1) bank portion exposes an upper end of a side surface of the (1-2) bank portion, the (2-1) bank portion exposes an upper end of a side surface of the (2-2) bank portion, and the (2-2) bank portion exposes an upper end of a side surface of the (2-3) bank portion.

A length of the upper end of the side surface of the (1-2) bank portion exposed by the (1-1) bank portion may be equal to a length of the upper end of the side surface of the (2-3) bank portion exposed by the (2-2) bank portion.

A length of the upper end of the side surface of the (2-3) bank portion exposed by the (2-2) bank portion may be less than a length of the upper end of the side surface of the (2-2) bank portion exposed by the (2-1) bank portion.

The at least one (1-2) bank portion may comprise (1-2) bank portions, and the (1-2) bank portions may be spaced apart from each other with the (1-1) bank disposed between the (1-2) bank portions.

The at least one (2-2) bank portion may comprise (2-2) bank portions, and the (2-2) bank portions may be spaced apart from each other with the (2-1) bank disposed between the (2-2) bank portions.

The at least one (2-3) bank portion may comprise (2-3) bank portions, and the (2-3) bank portions may be spaced apart from each other with the (2-1) bank portion and the (2-2) bank portions disposed between the (2-1) bank portion and the (2-2).

The display device may further comprise an insulating layer disposed between the first connection electrode and the bank layer and disposed between the second connection electrode and the bank layer.

The insulating layer may overlap the (1-2) bank portion in a plan view and may not overlap the (1-1) bank portion in a plan view.

The insulating layer may overlap the (2-3) bank portion in a plan view and may not overlap the (2-1) bank portion or the (2-2) bank portion in a plan view.

A side surface of the insulating layer may be aligned with the side surface of the (1-2) bank portion in a thickness direction.

The side surface of the insulating layer may be aligned with the side surface of the (2-3) bank portion in the thickness direction.

Each of the first connection electrode and the second connection electrode may overlap the first bank portion in a plan view.

The first connection electrode and the second connection electrode may not overlap the second bank portion in a plan view.

According to an embodiment, a method of fabricating a display device may include forming a first electrode extended in a first direction and a second electrode spaced apart from the first electrode in a second direction intersecting the first direction and extended in the first direction in each of sub-pixels included on a substrate; forming a bank layer extended in the first direction and the second direction on the first electrode and the second electrode and surrounding the sub-pixels; and forming light-emitting elements disposed on the first electrode and the second electrode, wherein the bank layer comprises a first bank portion extended in the second direction and overlapping the first connection electrode and the second connection electrode in a plan view, and a second bank portion extended in the first direction and not overlapping the first connection electrode and the second connection electrode in a plan view, the first bank portion comprises a (1-1) bank portion and at least one (1-2) bank portion connected to the (1-1) bank portion in the first direction and having an average height less than an average height of the (1-1) bank portion, the second bank portion comprises a (2-1) bank portion, at least one (2-2) bank portion connected to the (2-1) bank portion in the second direction and having an average height less than an average height of the (2-1) bank portion, and at least one (2-3) bank portion spaced apart from the (2-1) bank portion with the (2-2) bank portion disposed between the at least one (2-3) bank portion and the (2-1) bank portion and having an average height less than an average height of the (2-2) bank portion, the (1-1) bank portion exposes an upper end of a side surface of the (1-2) bank portion, the (2-1) bank portion exposes an upper end of a side surface of the (2-2) bank portion, and the (2-2) bank portion exposes an upper end of a side surface of the (2-3) bank portion.

A length of the upper end of the side surface of the (1-2) bank portion exposed by the (1-1) bank portion may be equal to a length of the upper end of the side surface of the (2-3) bank portion exposed by the (2-2) bank portion, and a length of the upper end of the side surface of the (2-3) bank portion exposed by the (2-2) bank portion may be less than a length of the upper end of the side surface of the (2-2) bank portion exposed by the (2-1) bank portion.

The at least one (1-2) bank portion may comprise (1-2) bank portions, and the (1-2) bank portions may be spaced apart from each other with the (1-1) bank portion disposed between the (1-2) bank portions, and the at least one (2-2) bank portion may comprise (2-2) bank portions, and the (2-2) bank portions may be spaced apart from each other with the (2-1) bank portion disposed between the (2-2) bank portions.

The at least one (2-3) bank portion may comprise (2-3) bank portions, and the (2-3) bank portions may be spaced apart from each other with the (2-1) bank portion and the (2-2) bank portions disposed between the (2-3) bank portions.

The method may further comprise an insulating layer disposed between the first connection electrode and the bank layer and disposed between the second connection electrode and the bank layer.

The insulating layer may overlap the (1-2) bank portion in a plan view and may not overlap the (1-1) bank portion in a plan view, and the insulating layer may overlap the (2-3) bank portion in a plan view and may not overlap the (2-1) bank portion or the (2-2) bank portion in a plan view.

A side surface of the insulating layer may be aligned with the side surface of the (1-2) bank portion in a thickness direction, the side surface of the insulating layer may be aligned with the side surface of the (2-3) bank portion in the thickness direction, the first connection electrode and the second connection electrode may overlap the first bank portion in a plan view, and the first connection electrode and the second closure electrode may not overlap the second bank portion in a plan view.

According to an embodiment of the disclosure, it is possible to prevent a disconnection of connection electrodes and increase the loading amount of an ink.

It should be noted that effects of the disclosure are not limited to those described above and other effects of the disclosure will be apparent to those skilled in the art from the following descriptions.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Figure 1:
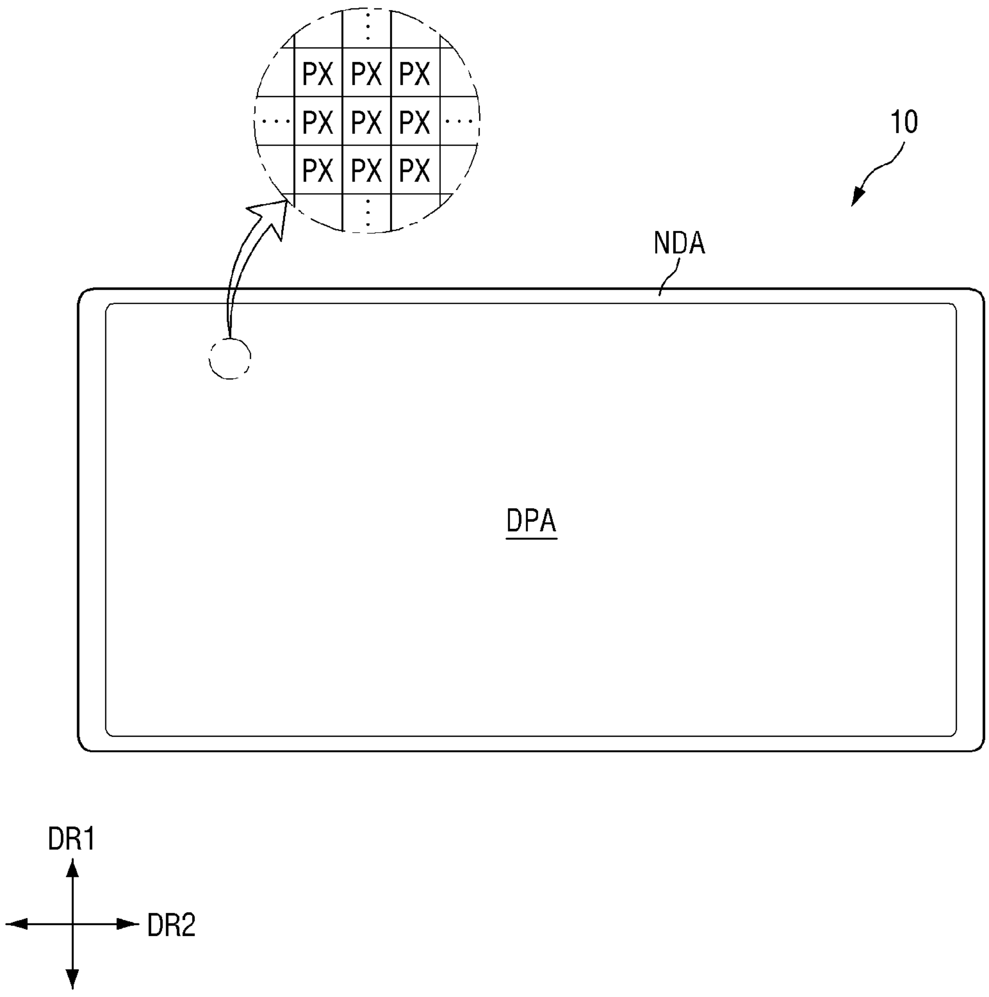
FIG. 1 is a schematic plan view of a display device according to an embodiment.

The disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

In the drawings, sizes, thicknesses, ratios, and dimensions of the elements may be exaggerated for ease of description and for clarity. Like numbers refer to like elements throughout.

As used herein, the singular forms, "a," "an," and "the" are intended to include the plural forms as well, unless the context clearly indicates otherwise.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

It will also be understood that when a layer is referred to as being "on" another layer or substrate, it can be directly on the other layer or substrate, or intervening layers may also be present. The same reference numbers indicate the same components throughout the specification.

It will be understood that, although the terms "first," "second," etc. may be used herein to describe various elements, these elements should not be limited by these terms. These terms are only used to distinguish one element from another element. For instance, a first element discussed below could be termed a second element without departing from the teachings of the disclosure. Similarly, the second element could also be termed the first element.

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as 'not overlapping' or 'to not overlap' another element, this may include that the elements are spaced apart from each other, offset from each other, or set aside from each other or any other suitable term as would be appreciated and understood by those of ordinary skill in the art.

The terms "face" and "facing" mean that a first element may directly or indirectly oppose a second element. In a case in which a third element intervenes between the first and second element, the first and second element may be understood as being indirectly opposed to one another, although still facing each other.

The terms "comprises," "comprising," "includes," and/or "including,", "has," "have," and/or "having," and variations thereof when used in this specification, specify the presence of stated features, integers, steps, operations, elements, components, and/or groups thereof, but do not preclude the presence or addition of one or more other features, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

Unless otherwise defined or implied herein, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, embodiments will be described with reference to the accompanying drawings.

FIG. 1 is a schematic plan view of a display device according to an embodiment.

Referring to FIG. 1, the display device 10 displays a moving image or a still image. A display device 10 may refer to any electronic device that provides a display screen. For example, the display device 10 may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and a digital camera, a camcorder, etc., within the spirit and the scope of the disclosure.

The display device 10 may include a display panel for providing a display screen. Examples of the display panel may include an inorganic light-emitting diode display panel, an organic light-emitting display panel, a quantum-dot light-emitting display panel, a plasma display panel, a field emission display panel, etc., within the spirit and the scope of the disclosure. In the following description, an inorganic light-emitting diode display panel is employed as an example of the display panel 10, but the disclosure is not limited thereto. Any other display panel may be employed as long as the technical idea of the disclosure can be equally applied.

The shape of the display device 10 may be modified in a variety of ways. For example, the display device 10 may have shapes such as a rectangle with longer lateral sides, a rectangle with longer vertical sides, a square, a quadrangle with rounded corners (vertices), other polygons, a circle, etc., within the spirit and the scope of the disclosure. The shape of a display area DPA of the display device 10 may also be similar to the overall shape of the display device 10. In the example shown in FIG. 1, the display device 10 has a rectangular shape with the longer sides in a second direction DR2. It is to be understood that the shapes disclosed herein may also include shapes substantial to the shapes disclosed herein.

The display device 10 may include a display area DPA and a non-display area NDA. In the display area DPA, images can be displayed. In the non-display area NDA, images are not displayed. The display area DPA may be referred to as an active area, while the non-display area NDA may also be referred to as an inactive area. The display area DPA may generally occupy the majority of the center of the display device 10.

The display area DPA may include pixels PX. The pixels PX may be arranged (or disposed) in a matrix. The shape of each pixel PX may be, but is not limited to, a rectangle or a square in case that viewed from the top. Each pixel may have a diamond shape having sides inclined with respect to a direction. The pixels PX may be arranged in stripes or in a pattern of islands. Each of the pixels PX may include at least one light-emitting element that emits light of a given wavelength band to.

The non-display area NDA may be disposed around the display area DPA. The non-display area NDA may surround the display area DPA entirely or partially. The display area DPA may have a rectangular shape, and the non-display area NDA may be disposed to be adjacent to the four sides of the display area DPA. The non-display area NDA may form the bezel of the display device 10. Lines or circuit drivers included in the display device 10 may be disposed in each of the non-display area NDA, or external devices may be mounted.

Figure 2:
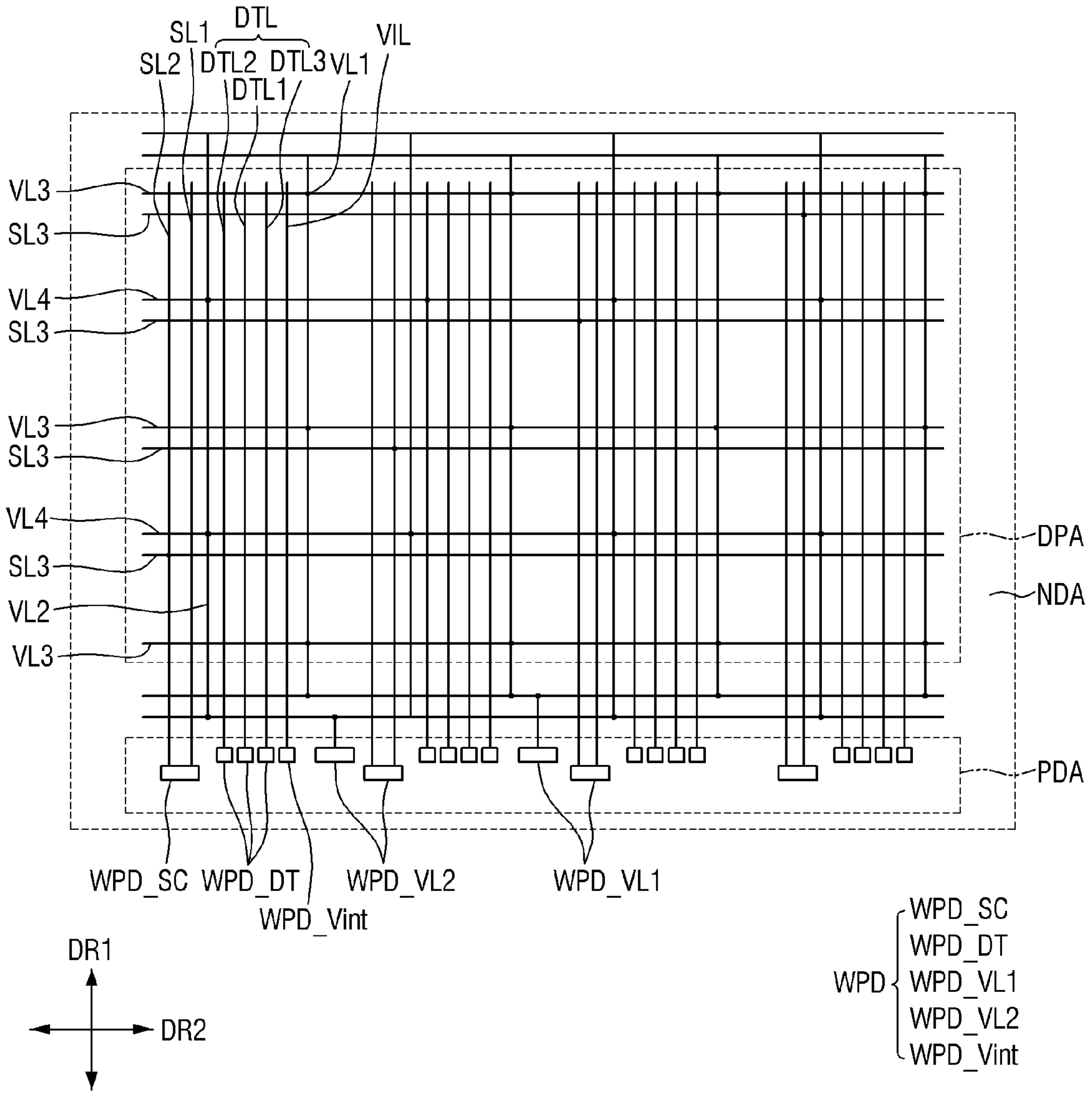
FIG. 2 is a schematic plan view showing arrangements of lines of a display device according to an embodiment.

FIG. 2 is a view schematically showing arrangements of lines in a display device according to an embodiment of the disclosure.

Referring to FIG. 2, the display device 10 may include lines. The display device 10 may include scan lines SL: SL1, SL2 and SL3, data lines DTL; DTL1, DTL2 and DTL3, an initialization voltage line VIL, and voltage lines VL; VL1, VL2, VL3 and VL4. Although not shown in the drawings, other lines may be further disposed in the display device 10. The lines may include lines formed of a first conductive layer and extended in the first direction DR1, and lines formed of a third conductive layer and extended in the second direction DR2. It is, however, to be understood that the lines may be extended in other directions. The first scan line SL1 and the second scan line SL2 may be extended in the first direction DR1. The first scan line SL1 and the second scan line SL2 may be disposed adjacent to each other, and may be spaced apart from other first and second scan lines SL1 and SL2 in the second direction DR2. The first scan line SL1 and the second scan line SL2 may be connected to a scan wire pad WPD_SC connected to a scan driver (not shown). The first scan line SL1 and the second scan line SL2 may be extended from a pad area PDA located (or disposed) in the non-display area NDA to the display area DPA.

The third scan line SL3 may be extended in the second direction DR2, and may be spaced apart from another third scan line SL3 in the first direction DR1. One third scan line SL3 may be connected to one or more first scan lines SL1 or one or more second scan lines SL2. The scan lines SL may have, but is not limited to, a mesh structure on the entire surface of the display area DPA.

As used herein, when an element is referred to as being "connected" or "coupled" to another element, it can be directly connected or coupled to the element or intervening elements may be present. Such elements may be understood as a single integrated element with one portion thereof connected to another portion. Moreover, when an element is referred to as being "connected" to another element, it may be in direct contact with the element and also electrically connected to the element. It will be understood that the terms "connected to" or "coupled to" may include a physical or electrical connection or coupling.

The data lines DTL may be extended in the first direction DR1. The data lines DTL may include a first data line DTL1, a second data line DTL2 and a third data line DTL3. The first to third data lines DTL1, DTL2 and DTL3 are disposed adjacent to one another as a group. The data lines DTL1, DTL2 and DTL3 may be extended from the pad area PDA located in the non-display area NDA to the display area DPA. It should be understood, however, that the disclosure is not limited thereto. The data lines DTL may be equally spaced apart from one another a first voltage line VL1 and a second voltage line VL2 to be described later.

The initialization voltage line VIL may be extended in the first direction DR1. The initialization voltage line VIL may be disposed between the data lines DTL and the first voltage line VL1. The initialization voltage line VIL may be extended from the pad area PDA located in the non-display area NDA to the display area DPA.

The first voltage line VL1 and the second voltage line VL2 may be extended in the first direction DR1, and the third voltage line VL3 and the fourth voltage line VL4 may be extended in the second direction DR2. The first voltage line VL1 and the second voltage line VL2 may be arranged alternately in the second direction DR2, and the third voltage line VL3 and the fourth voltage line VL4 may be arranged alternately in the first direction DR1. The first voltage lines VL1 and the second voltage lines VL2 may be extended in the first direction DR1 and may traverse the display area DPA. Some or a number of the third voltage line VL3 and the fourth voltage lines VL4 may be disposed in the display area DPA while the others may be disposed in the non-display area NDA located on the both sides of the display area DPA in the first direction DR1. The first voltage line VL1 and the second voltage line VL2 may be formed of a first conductive layer, and the third voltage line VL3 and the fourth voltage line VL4 may be formed of a third conductive layer different from the first conductive layer. The first voltage line VL1 may be connected to at least one third voltage line VL3, and the second voltage line VL2 may be connected to at least one fourth voltage line VL4. The voltage lines VL; VL1, VL2, VL3 and VL4 may have a mesh structure in the entirely display are DPA. It is, however, to be understood that the disclosure is not limited thereto.

The first scan lines SL1, the second scan lines SL2, the data lines DTL, the initialization voltage line VIL, the first voltage lines VL1 and the second voltage lines VL2 may be electrically connected to at least one wire pad WPD. The wire pads WPD may be disposed in the non-display areas NDA. According to the embodiment of the disclosure, the wire pads WPD may be disposed in the pad area PDA located on the lower side of the display area DPA that is the opposite in the first direction DR1. The first and second scan lines SL1 and SL2 may be connected to the scan wire pad WPD_SC disposed in the pad area PDA, and the data lines DTL may be connected to different data wire pads WPD_DT, respectively. The initialization voltage line VIL may be connected to the initialization wiring pad WPD_Vint, the first voltage line VL1 may be connected to a first voltage wire pad WPD_VL1, and the second voltage line VL2 may be connected to the second voltage wire pad WPD_VL2. External devices may be mounted on the wire pads WPD. External devices may be mounted on the wire pads WPD by an anisotropic conductive film, ultrasonic bonding, etc., within the spirit and the scope of the disclosure. Although the wire pads WPD are disposed in the pad area PDA located on the lower side of the display area DPA in the drawings, the disclosure is not limited thereto. Some or a number of the wire pads WPD may be disposed on the upper side or on one of the left and right sides of the display area DPA.

Each of the pixels PX or sub-pixels SPXn of the display device 10 may include a pixel driving circuit, where n is an integer of 1 to 3. The above-described lines may pass through each of the pixels PX or the periphery thereof to apply a driving signal to the pixel driving circuit. The pixel driving circuit may include a transistor and a capacitor. The numbers of transistors and capacitors of each pixel driving circuit may be changed in a variety of ways. According to an embodiment of the disclosure, each of the sub-pixels SPXn of the display device 10 may have a 3T1C structure, for example, a pixel driving circuit may include three transistors and one capacitor. In the following description, the pixel driving circuit having the 3T1C structure will be described as an example. It is, however, to be understood that the disclosure is not limited thereto. A variety of modified structure may be employed such as a 2T1C structure, a 7T1C structure and a 6T1C structure.

Figure 3:
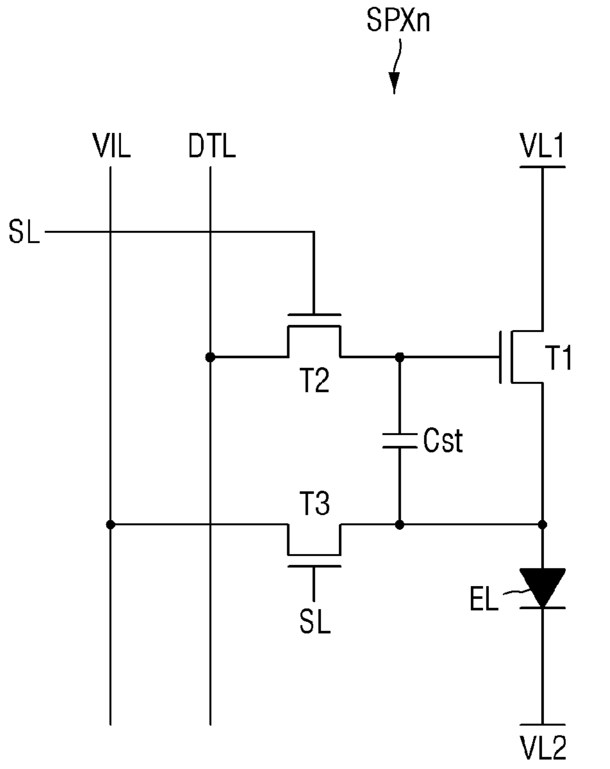
FIGS. 3 and 4 are pixel circuit diagrams of a display device according to an embodiment.
Figure 4:
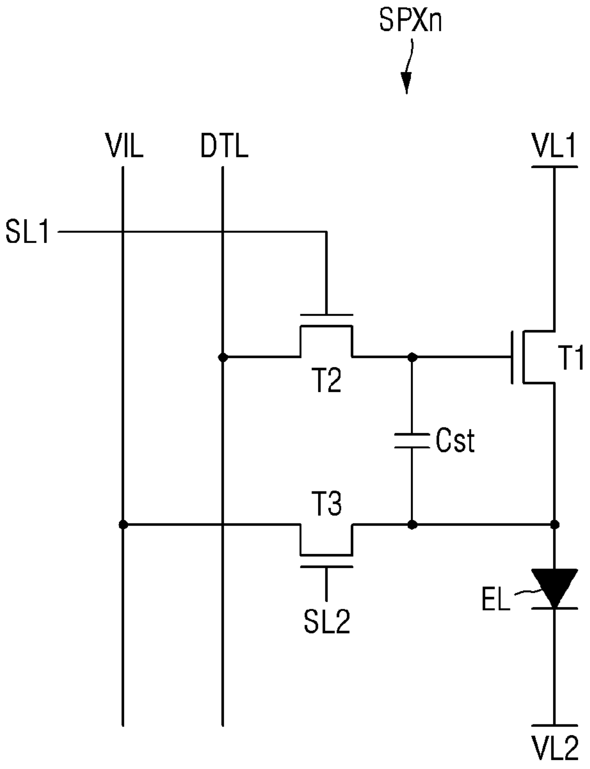

FIGS. 3 and 4 are pixel circuit diagrams of a display device according to an embodiment.

Referring to FIG. 3, each of the sub-pixels SPXn of the display device 10 according to an embodiment may include three transistors T1, T2 and T3 and one storage capacitor Cst in addition to a light-emitting diode EL.

The light-emitting diode EL emits light in proportional to the current supplied through the first transistor T1. The light-emitting diode EL may include a first electrode, a second electrode, and at least one light-emitting element disposed therebetween. The light-emitting element may emit light in a given wavelength range by an electric signal transmitted from the first electrode and the second electrode.

A first end of the light-emitting diode EL may be connected to a source electrode of the first transistor T1, and a second end thereof may be connected to a second voltage line VL2 from which a low-level voltage (hereinafter referred to as a second supply voltage) lower than a high-level voltage (hereinafter referred to as a first supply voltage) of a first voltage line VL1 is applied.

The first transistor T1 adjusts a current flowing from the first voltage line VL1 from which the first supply voltage is supplied to the light-emitting diode EL according to the voltage difference between a gate electrode and the source electrode. For example, the first transistor T1 may be a driving transistor for driving the light-emitting diode EL. The gate electrode of the first transistor T1 may be connected to a source electrode of the second transistor T2, the source electrode thereof may be connected to the first electrode of the light-emitting diode EL, and the drain electrode thereof may be connected to the first voltage line VL1 from which the first supply voltage is applied.

The second transistor T2 is turned on by a scan signal of the first scan line SL1 to connect the data line DTL with the gate electrode of the first transistor T1. The gate electrode of the second transistor T2 may be connected to the first scan line SL1, the source electrode thereof may be connected to the gate electrode of the first transistor T1, and the drain electrode thereof may be connected to the data line DTL.

A third transistor T3 may be turned on by a scan signal of a second scan line SL2 to connect the initialization voltage line VIL with the first end of the light-emitting diode EL. The gate electrode of the third transistor T3 may be connected to the second scan line SL2, the drain electrode thereof may be connected to the initialization voltage line VIL, and the source electrode thereof may be connected to one end or an end of the light-emitting diode EL or the source electrode of the first transistor T1.

The source electrode and the drain electrode of each of the transistors T1, T2 and T3 are not limited to those described above. They may be connected in the opposite way. Each of the transistors T1, T2 and T3 may be formed as a thin-film transistor. Although each of the transistors T1, T2 and T3 implemented as an n-type MOSFET (metal oxide semiconductor field effect transistor) in the example shown in FIG. 3, the disclosure is not limited thereto. For example, each of the transistors T1, T2 and T3 may be implemented as a p-type MOSFET, or some or a number of the transistors T1, T2 and T3 may be implemented as n-type MOSFETs while the others may be implemented as p-type MOSFETs.

The storage capacitor Cst is formed between the gate electrode and the source electrode of the first transistor T1. The storage capacitor Cst stores a voltage difference between the gate voltage and the source voltage of the first transistor T1.

According to the embodiment of FIG. 3, the gate electrode of the second transistor T2 may be connected to the first scan line SL1, and the gate electrode of the third transistor T3 may be connected to the second scan line SL2. The first scan line SL1 and the second scan line SL2 may be different scan lines, and the second transistor T2 and the third transistor T3 may be turned on in response to scan signals applied from different scan lines. It is, however, to be understood that the disclosure is not limited thereto.

Referring to FIG. 4, the gate electrodes of the second transistor T2 and the third transistor T3 may be connected to the same scan line SL. The second transistor T2 and the third transistor T3 may be simultaneously turned on by a scan signal applied from the same scan line.

Hereinafter, the structure of one pixel PX of the display device 10 according to an embodiment will be described in detail with reference to other drawings.

Figure 5:
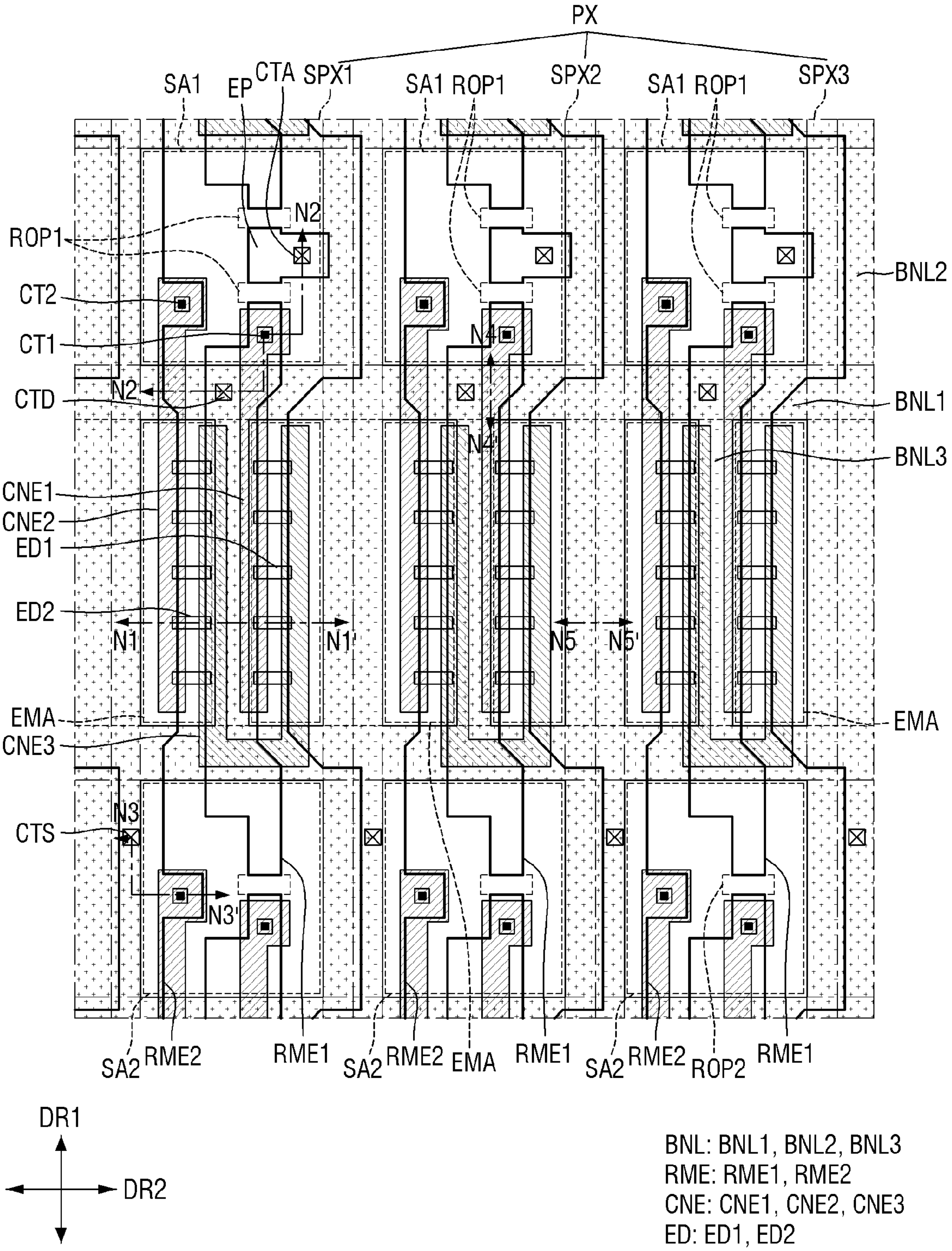
FIG. 5 is a schematic plan view showing a pixel of a display device according to an embodiment.
Figure 6:
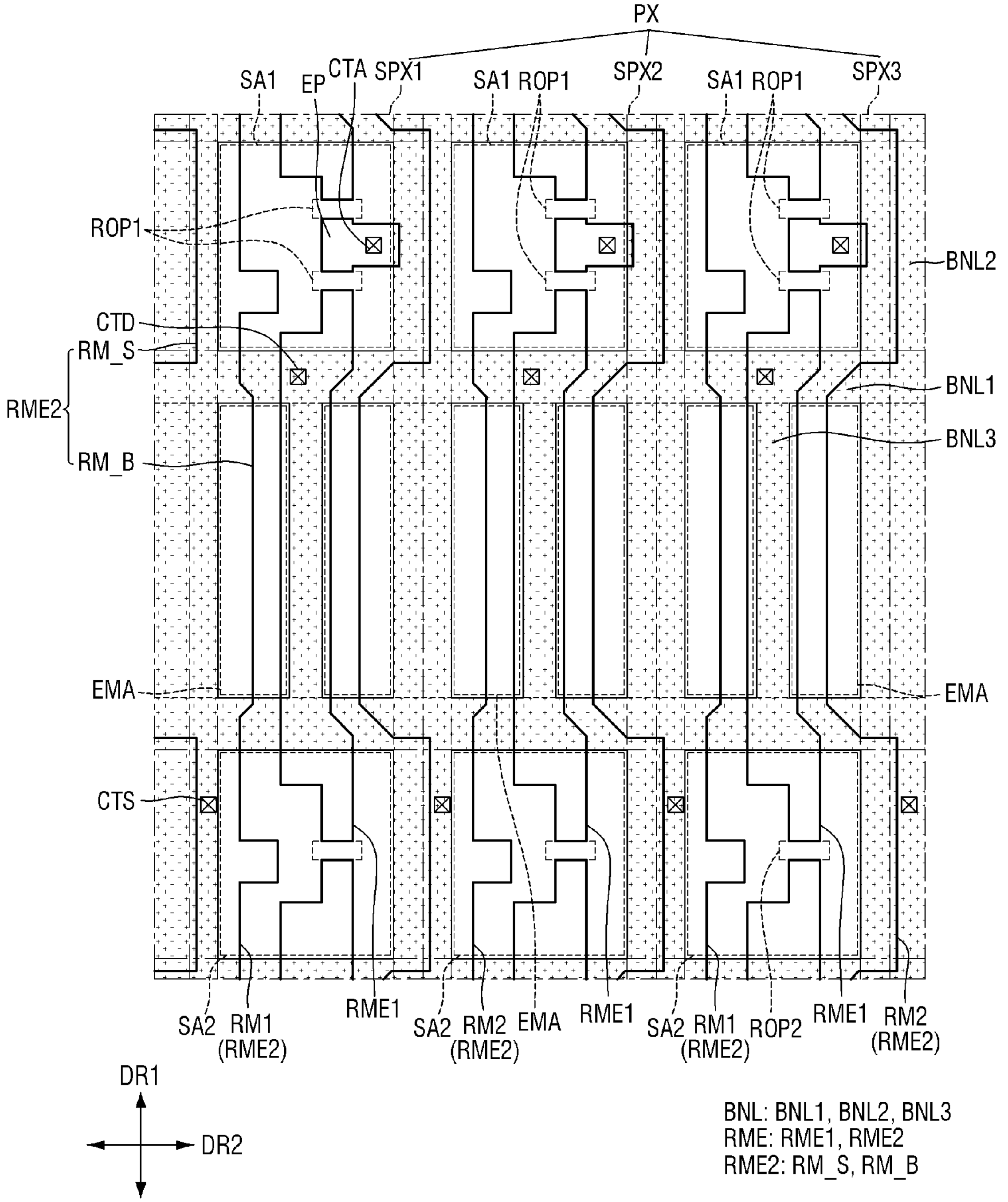
FIG. 6 is a schematic plan view showing arrangements of electrodes and a bank layer disposed in one pixel of FIG. 5.
Figure 7:
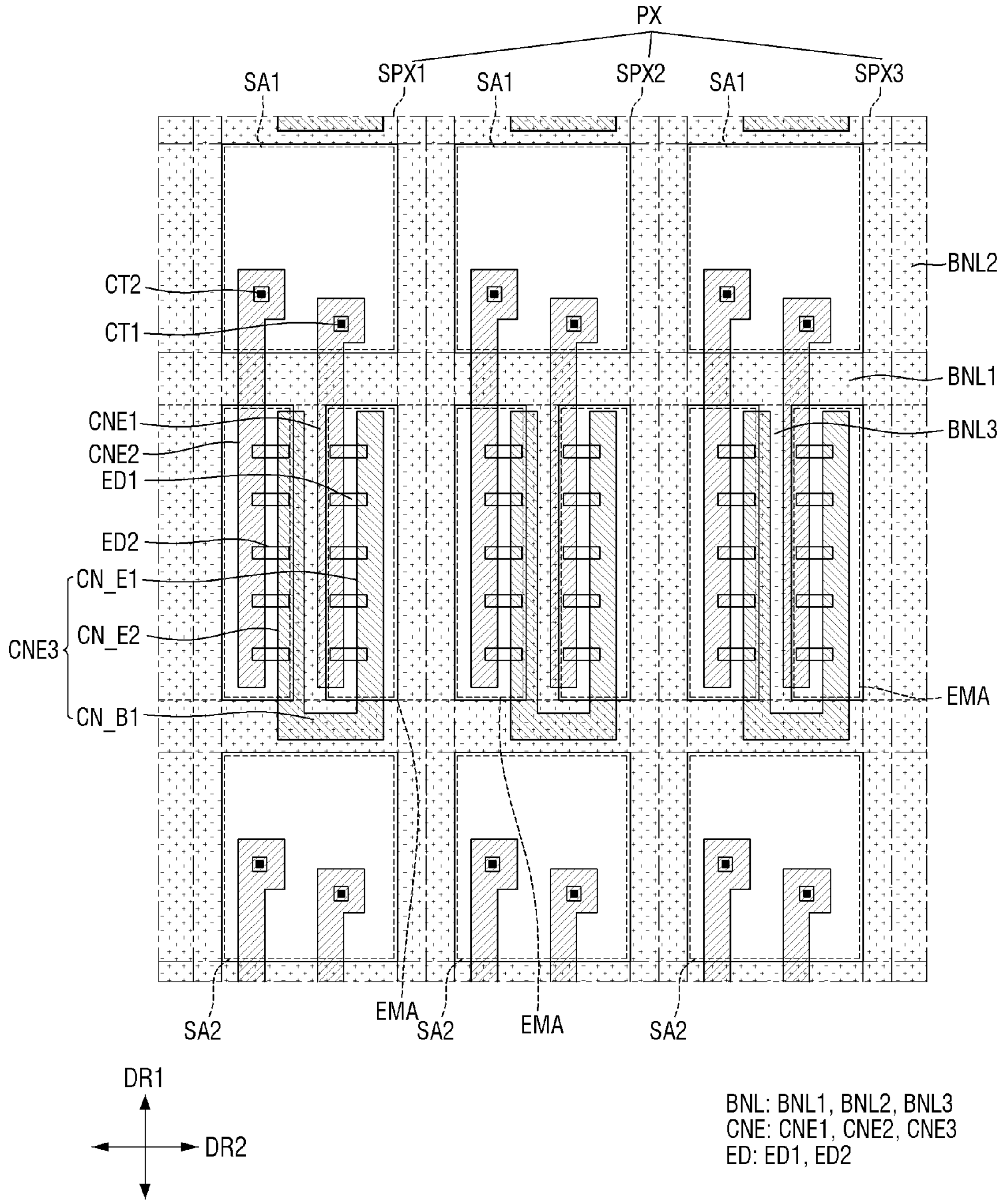
FIG. 7 is a schematic plan view showing arrangements of connection electrodes and light-emitting elements disposed in one pixel of FIG. 5.

FIG. 5 is a schematic plan view showing a pixel of a display device according to an embodiment of the disclosure. FIG. 6 is a schematic plan view showing arrangements of electrodes and a bank layer disposed in one pixel of FIG. 5. FIG. 7 is a schematic plan view showing arrangements of connection electrodes and light-emitting elements disposed in one pixel of FIG. 5.

FIG. 5 shows arrangements of electrodes RME; RME1 and RME2, a bank layer BNL, light-emitting elements ED; ED1 and ED2, and connection electrodes CNE: CNE1, CNE2 and CNE3 disposed in a pixel PX of a display device 10 in case that viewed from the top. FIG. 6 shows arrangements of electrodes RME; RME1 and RME2 and the bank layer BNL in the pixel PX shown in FIG. 5, while FIG. 7 shows arrangements of light-emitting elements ED; ED1 and ED2, and connection electrodes CNE: CNE1, CNE2 and CNE3 together with the bank layer BNL.

Referring to FIGS. 5 to 7, each of the pixels PX of the display device 10 may include sub-pixels SPXn. For example, a pixel PX may include a first sub-pixel SPX1, a second sub-pixel SPX2 and a third sub-pixel SPX3. The first sub-pixel SPX1 may emit light of a first color, the second sub-pixel SPX2 may emit light of a second color, and the third sub-pixel SPX3 may emit light of a third color. For example, the first color may be blue, the second color may be green, and the third color may be red. It is, however, to be understood that the disclosure is not limited thereto. All the sub-pixels SPXn may emit light of a same color. According to an embodiment of the disclosure, the sub-pixels SPXn may emit blue light. Although the single pixel PX may include three sub-pixels SPXn in the example shown in the drawings, the disclosure is not limited thereto. The pixel PX may include more than three sub-pixels SPXn.

Each of the sub-pixels SPXn of the display device 10 may include an emission area EMA and a non-emission area. In the emission area EMA, where light-emitting diodes ED are disposed to emit light of a given wavelength band. In the non-emission area, the light-emitting diodes ED are not disposed and the lights emitted from the light-emitting diodes ED do not reach, and thus no light exits therefrom.

The emission area EMA may include an area in which the light-emitting elements ED are disposed, and may include an area adjacent to the light-emitting elements ED where lights emitted from the light-emitting elements ED exit. For example, the emission area EMA may also include an area in which lights emitted from the light-emitting elements ED are reflected or refracted by other elements to exit. The light-emitting diodes ED may be disposed in each of the sub-pixels SPXn, and the emission area may include the area where the light-emitting elements are disposed and the adjacent area.

Although the emission areas EMA of the sub-pixels SPXn have the uniform area in the example shown in the drawings, the disclosure is not limited thereto. In an embodiment, the emission areas EMA of the sub-pixels SPXn may have different areas depending on a color or wavelength band of light emitted from the light-emitting diodes ED disposed in the respective sub-pixels.

Each of the sub-pixels SPXn may further include subsidiary areas SA1 and SA2 disposed in the non-emission area. The subsidiary areas SA1 and SA2 may include a first subsidiary area SA1 located on the upper side of the emission area EMA that is one side or a side in the first direction DR1, and a second subsidiary area SA2 located on the lower side of the emission area EMA that is the opposite side in the first direction DR1. The emission area EMA and the subsidiary areas SA1 and SA2 may be alternately arranged in the first direction DR1 according to the arrangements of the pixels PX and the sub-pixels SPXn, and the first substrate area SA1 or the second subsidiary area SA2 may be located between different emission areas EMA spaced apart from each other in the first direction DR1. For example, the emission areas EMA may be repeatedly arranged in the first direction DR1 with the first subsidiary area SA1 or the second subsidiary area SA2 therebetween. The emission areas EMA, the first subsidiary areas SA1 and the second subsidiary areas SA2 may be repeatedly arranged in the second direction DR2. The first subsidiary area SA1 and the second subsidiary area SA2 may be distinguished from one another depending on the arrangements of line connection electrodes EP and the electrodes RME, which will be described later. It is, however, to be understood that the disclosure is not limited thereto. The emission areas EMA and the subsidiary areas SA1 and SA2 of the pixels PX may have arrangements different from those of FIGS. 5 and 6.

The first subsidiary area SA1 and the second subsidiary area SA2 may be shared by the sub-pixels SPXn adjacent to each other in the first direction DR1. For example, the second subsidiary area SA2 shown in FIGS. 5 and 6 may be shared by the sub-pixel SPXn shown in the drawings and another sub-pixel SPXn adjacent to it in the first direction DR1 which is not shown in the drawings. In each of the sub-pixels SPXn shown in the drawings, the first subsidiary area SA1 may be located on the upper side of the emission area EMA. In each of the sub-pixels SPXn adjacent to them in the first direction DR1, the second subsidiary area SA2 may be located on the upper side of the emission area EMA.

No light-emitting element ED is disposed in the subsidiary areas SA1 and SA2 and thus no light exits therefrom. The electrodes RME disposed in the sub-pixels SPXn may be partially disposed in the subsidiary areas SA1 and SA2. The electrodes RME disposed in different sub-pixels SPXn may be disconnected at separation regions ROP (ROP1, ROP2) of the subsidiary areas SA1 and SA2.

According to the embodiment of the disclosure, the display device 10 may include electrodes RME: RME1 and RME2, a bank layer BNL, light-emitting elements ED, and connection electrodes CNE: CNE1 and CNE2.

The electrodes RME: RME1 and RME2 have a shape extended in one direction or a direction and are disposed in each of the sub-pixels SPXn. The electrodes RME1 and RME2 may be extended in the first direction DR1 to be disposed in the emission area EMA of the sub-pixel SPXn, and they may be spaced apart from one another in the second direction DR2. The electrodes RME may be electrically connected to the light-emitting elements ED. It should be understood, however, that the disclosure is not limited thereto. The electrodes RME may not be electrically connected to the light-emitting elements ED.

The display device 10 may include the first electrode RME1 disposed in each of the sub-pixels SPXn, and the second electrode RME2 disposed across different the sub-pixels SPXn. The first electrode RME1 may be disposed adjacent to the center of the sub-pixel SPXn and may be disposed across the emission area EMA and the subsidiary areas SA1 and SA2. The second electrode RME2 may be spaced apart from the first electrode RME1 in the second direction DR2 in the emission area EMA and may be disposed across the sub-pixels SPXn. The first electrode RME1 and the second electrode RME2 may have a shape generally extended in the first direction DR1, and may have different lengths in the first direction DR1 and different shapes in the emission area EMA.

The first electrode RME1 may be disposed at the center of the sub-pixel SPXn, and may be disposed on a first bank pattern BNL3 in the emission area EMA. The first electrode RME1 may be extended from the first subsidiary area SA1 in the first direction DR1 to the second subsidiary area SA2 through the emission area EMA. The width of the first electrode RME1 measured in the second direction DR2 may vary depending on the positions, and may be larger than the width of the first bank pattern BNL3 where it overlaps the first bank pattern BNL3 at least in the emission area EMA.

The second electrode RME2 may include a portion extended in the first direction DR1 and a wider portion in the vicinity of the emission area EMA. According to the embodiment, the second electrode RME2 may include an electrode stem RM_S extended in the first direction DR1, and an electrode branch RM_B connected to or extended from the electrode stem RM_S and wider than it in the second direction DR2.

The electrode stem RM_S may be disposed to overlap a portion of the bank layer BNL extended in the first direction DR1, and may be disposed on one side or a side of the substrate areas SA in the second direction DR2. The electrode stem RM_S of the second electrode RME2 may be disposed between the first subsidiary areas SA1 and between the second subsidiary areas SA2 of the sub-pixels SPXn adjacent to each other in the second direction DR2. The electrode stem RM_S may be disposed between the subsidiary areas SA1 and SA2 adjacent to each other in the second direction DR2, and may partially protrude to the subsidiary areas SA1 and SA2.

The electrode branch RM_B may be disposed on the both sides of the center of the sub-pixel SPXn in the second direction DR2 and may be disposed on the second bank pattern BNL2. The second electrode RME2 may have a shape that its width in the second direction DR2 increases where a portion of the bank layer BNL extended in the first direction DR1 intersects a portion thereof extended in the second direction DR2. The electrode branch RM_B may be disposed across the emission areas EMA of the sub-pixels SPXn adjacent to each other in the second direction DR2, and may overlap the area between the sub-pixels SPXn. The electrode branch RM_B may overlap the portion of the bank layer BNL extended in the first direction DR1 that is disposed between adjacent sub-pixels SPXn. The second electrodes RME2 may be extended generally in the first direction DR1 and may be disposed between the sub-pixels SPXn adjacent to each other in the second direction DR2. The second electrodes RME2 may be divided into different electrode lines RM1 and RM2 disposed on the both sides of the first electrode RME1 in the second direction DR2. The second electrodes RME2 may include different first electrode lines RM1 and second electrode lines RM2, which may be alternately arranged in the second direction DR2. For example, in the first sub-pixel SPX1, the second electrode RME2 disposed on the left side of the first electrode RME1 may be the first electrode line RM1, and the second electrode RME2 disposed on the right side of the first electrode RME1 may be the second electrode line RM2. In the second sub-pixel SPX2, the second electrode RME2 disposed on the left side of the first electrode RME1 may be the second electrode line RM2, and the second electrode RME2 disposed on the right side of the first electrode RME1 may be the first electrode line RM1. In the third sub-pixel SPX3, the second electrode RME2 disposed on the left side of the first electrode RME1 may be the first electrode line RM1, and the second electrode RME2 disposed on the right side of the first electrode RME1 may be the second electrode line RM2.

The width of the first electrode RME1 measured in the second direction DR2 may be greater than the width of the electrode stem RM_S of the second electrode RME2 but smaller than the width of the electrode branch RM_B. The first electrode RME1 may have a width greater than that of the first bank pattern BNL3 and overlap the both sides. The electrode stem RM_S of the second electrode RME2 may have a relatively small width so that it is disposed between the subsidiary areas SA1 and SA2, while the electrode branch RM_B may have a width larger than that of the first electrode RME1.

The first electrode RME1 may be disposed in each sub-pixel SPXn, whereas the electrode branch RM_B of the second electrode RME2 may be disposed across adjacent sub-pixels SPXn. The sub-pixels SPXn adjacent to each other in the second direction DR2 may share the electrode branch RM_B of the second electrode RME2.

According to the embodiment, the electrode branch RM_B of the second electrode RME2 may be disposed to cover between the emission areas EMA of adjacent sub-pixels SPXn. Light-emitting elements ED may be disposed in each of the emission areas EMA, and the light-emitting elements ED may be disposed between the first bank pattern BNL3 and the second bank pattern BNL2. As will be described later, the both ends of the light-emitting elements ED may be disposed on the electrodes RME1 and RME2 by an electric field generated on the first electrode RME1 and the second electrode RME2 between the first bank pattern BNL3 and second bank pattern BNL2.

The first electrode RME1 may be in contact with a first conductive pattern CDP1 of the third conductive layer through a first electrode contact hole CTD where it overlaps the portion of the bank layer BNL extended in the second direction DR2. The electrode stem RM_S of the second electrode RME2 may be in contact with a second conductive pattern CDP2 of the third conductive layer through a second electrode contact hole CTS where it overlaps the portion of the bank layer BNL extended in the first direction DR1. The first electrode RME1 may be disposed such that it overlaps the first contact CT1 in the sub area SA. The second electrode RME2 may include a portion protruding from the electrode stem RM_S in the second direction DR2 and disposed in the subsidiary areas SA, and the protruding portion may overlap the second contact CT2.

The first electrode RME1 may be disposed up to the separation regions ROP1 and ROP2 of the subsidiary areas SA1 and SA2 so that the first electrode RME1 of a sub-pixel SPXn may be disconnected from that of another sub-pixel SPXn adjacent to it in the first direction DR1. On the other hand, the second electrode RME2 may not be disconnected at the subsidiary areas SA1 and SA2, and one second electrode RME2 may be disposed across the sub-pixels SPXn adjacent to each other in the first direction DR1. One second electrode RME2 may include electrode stems RM_S and electrode branches RM_B, may be extended in the first direction DR1, and may have a shape with different widths between the emission area EMA and the subsidiary areas SA1 and SA2 of each of the sub-pixels SPXn. The first electrode RME1 may be disposed between the separation regions ROP1 and ROP2 disposed in different subsidiary areas SA1 and SA2 of each of the sub-pixels SPXn and may traverse the emission area EMA.

The display device 10 may include a line connection electrode EP that is disposed in the first subsidiary area SA1 among the subsidiary areas SA1 and SA2 of each of the sub-pixels SPXn and is disposed between the first electrodes RME1 of different sub-pixels SPXn. In the second subsidiary area SA of the sub-pixel SPXn, the line connection electrode EP is not disposed, the first electrodes RME1 of different sub-pixels SPXn adjacent to one another in the first direction DR1 may be spaced apart from one another.

In the sub-pixel SPXn shown in FIGS. 5 and 6 among the sub-pixels SPXn, the first subsidiary area SA1 in which the line connection electrode EP is disposed is located on the upper side of the emission area EMA, while the second subsidiary area SA2 may be disposed on the lower side of the emission area EMA. On the other hand, in the sub-pixel SPXn adjacent to the sub-pixel SPXn of FIGS. 5 and 6 in the first direction DR1, the first subsidiary area SA1 in which the line connection electrode EP is disposed may be disposed on the lower side of the emission area EMA, and the second subsidiary area SA2 may be disposed on the upper side of the emission area EMA.

The first electrode RME1 may be spaced apart from the line connection electrode EP in the first subsidiary area SA1 with the first separation region ROP1 therebetween. Two first separation regions ROP1 may be located in one first sub-area SA1. The line connection electrode EP may be spaced apart from the first electrode RME1 disposed in the sub-pixel SPXn with the lower first separation region ROP1 therebetween, and may be spaced apart from the first electrode RME1 disposed in another sub-pixel SPXn with the upper first separation region ROP1 therebetween. One second separation region ROP2 may be located in the second subsidiary area SA2, and different first electrodes RME1 may be spaced apart from each other in the first direction DR1.

Although one first electrode RME1 is disposed and different second electrodes RME2 are disposed in each of the sub-pixels SPXn in the example shown in the drawings, the disclosure is not limited thereto. For example, in the display device 10, a greater number of electrodes RME may be disposed in one sub-pixel SPXn, or the arrangement and shape of the electrodes RME may be altered.

The bank layer BNL may be disposed to surround the sub-pixels SPXn, the emission areas EMA and the subsidiary areas SA. The bank layer BNL may be disposed between the sub-pixels SPXn adjacent to each other in the first direction DR1 and the second direction DR2, and may also be disposed between the emission area EMA and the subsidiary area SA. The sub-pixels SPXn, the emission areas EMA and the subsidiary areas SA1 and SA2 of the display device 10 may be distinguished from one another by the bank layer BNL, which may be openings of the bank layer BNL. The distance between the sub-pixels SPXn, the emission areas EMA and the subsidiary areas SA1 and SA2 may vary depending on the width of the bank layer BNL.

The bank layer BNL may be disposed in a lattice pattern on the front surface of the display area DPA including portions extended in the first direction DR1 and the second direction DR2 in case that viewed from the top. The bank layer BNL may be disposed along the border of each of the sub-pixels PXn to distinguish between adjacent sub-pixels PXn. The bank layer BNL may be disposed to surround the emission area EMA and the subsidiary areas SA1 and SA2 disposed in each of the sub-pixels SPXn to distinguish between them.

As shown in FIG. 7, the bank layer BNL may include a first bank portion BNL1 extended in the second direction DR2 and overlapping the first connection electrode CNE1 and the second connection electrode CNE2, and a second bank portion BNL2 extended in the first direction DR1 and overlapping none of the first connection electrode CNE1 and the second connection electrode CNE2. The bank layer BNL may further include a third bank portion BNL3 disposed on the emission area EMA. One end or an end of the first bank portion BNL1 in the second direction DR2 may be connected to or directly connected to the second bank portion BNL2 located on one side or a side of the first bank portion BNL1 in the second direction DR2. The opposite end of the first bank portion BNL1 in the second direction DR2 may be connected to or directly connected to the second bank portion BNL2 located on the opposite side of the first bank portion BNL1 in the second direction DR2. One end or an end of the third bank portion BNL3 in the first direction DR1 may be connected to or directly connected to the first bank portion BNL1 located on one side or a side of the third bank portion BNL3 in the first direction DR1. The opposite end of the third bank portion BNL3 in the first direction DR1 may be connected to or directly connected to the first bank portion BNL1 located at the opposite side of the third bank portion BNL3 in the first direction DR1.

The light-emitting elements ED may be disposed in the emission area EMA. The light-emitting elements ED may be disposed between the bank patterns BNL3 and BNL2 and may be spaced apart from one another in the first direction DR1. According to an embodiment of the disclosure, the light-emitting elements ED may have a shape extended in one direction or a direction, and the both ends to light-emitting elements ED may be disposed on different electrodes RME, respectively. The length of the light-emitting elements ED may be larger than the distance between the electrodes RME spaced apart from each other in the second direction DR2. The direction in which the light-emitting elements ED are generally extended may be perpendicular to the first direction DR1 in which the electrodes RME are extended. It is, however, to be understood that the disclosure is not limited thereto. The direction in which the light-emitting elements ED are extended may face the second direction DR2 or a direction obliquely thereto.

The light-emitting elements ED may include first light-emitting elements ED1 having both ends disposed on one of the first electrode RME1 and the second electrode RME2, and second light-emitting elements ED2 having both ends disposed on the first electrode RME1 and another second electrode RME2. In the first sub-pixel SPX1, the first light-emitting elements ED1 may be disposed on the second electrode RME2 of the second electrode line RM2, and the second light-emitting elements ED2 may be disposed on the second electrode RME2 of the first electrode line RM1. The first light-emitting elements ED1 may be disposed on the right side of the first electrode RME1, and the second light-emitting elements ED2 may be disposed on the left side of the first electrode RME1. The first light-emitting elements ED1 and the second light-emitting elements ED may be disposed on the first electrode RME1 and the second electrode RME2, and the second electrode RME2 on which the first light-emitting elements ED1 are disposed may be different from the second electrode RME2 on which the second light-emitting elements ED2 are disposed.

According to the embodiment of the disclosure, as the second electrode RME2 may include the electrode branch RM_B and is disposed in different sub-pixels SPXn, some or a number of the light-emitting elements ED disposed in different sub-pixels SPXn may be disposed on the same second electrode RME2. For example, the first ends of the first light-emitting elements ED1 of the first sub-pixel SPX1 may be disposed on the second electrode RME2 of the second electrode line RM2, and the first ends of the second light-emitting elements ED2 of the second sub-pixel SPX2 may also be disposed on the second electrode RME2 of the second electrode line RM2. In the display device 10, one electrode RME is disposed in the sub-pixels SPXn, and thus the sub-pixels SPXn may share the electrode RME on which the light-emitting elements ED are disposed. As will be described later, the second supply voltage, which is a common voltage, is applied to the second electrode RME2, and thus there is no problem even though different sub-pixels SPXn share the second electrode RME2.

The connection electrodes CNE; CNE1, CNE2 and CNE3 may be disposed on the electrodes RME and the bank patterns BNL3 and BNL2. The connection electrodes CNE may each have a shape extended in one direction or a direction and may be spaced apart from one another. The connection electrodes CNE may be in contact with the light-emitting elements ED and may be electrically connected to the electrodes RME or a conductive layer thereunder.

The connection electrodes CNE may include the first connection electrode CNE1, the second connection electrode CNE2 and the third connection electrode CNE3 disposed in each sub-pixel SPXn.

The first connection electrode CNE1 may have a shape extended in the first direction DR1 and may be disposed on the first electrode RME1. The first connection electrode CNE1 may be disposed to overlap the first electrode RME1, and may be extended from the emission area EMA in the first direction DR1 to be disposed in first subsidiary area SA1 located on the upper side of the emission area EMA. The first connection electrode CNE1 may be in contact with the first electrode RME1 through the first contact CT1 formed on the first electrode RME1 in the first subsidiary area SA1. The first connection electrode CNE1 may overlap the first bank portion BNL1.

The second connection electrode CNE2 may be spaced apart from the first connection electrode CNE1 in the second direction DR2, may have a shape extended in the first direction DR1, and may be disposed on the second electrode RME2. The second connection electrode CNE2 may be disposed on the second electrode RME2 disposed on the left side of the first electrode RME1, for example, on the second electrode RME2 of the first electrode line RM1 in the first sub-pixel SPX1. The second connection electrode CNE2 may be disposed to overlap the electrode branch RM_B of the second electrode RME2, and may be extended from the emission area EMA in the second direction DR2 to be disposed in second subsidiary area SA2 located on the upper side of the emission area EMA. The second connection electrode CNE2 may be in contact with the second electrode RME2 through the second contact hole CT2 formed on the second electrode RME2 in the first sub-area SA1. The second connection electrode CNE2 may overlap the first bank portion BNL1 and the third bank portion BNL3.

The third connection electrode CNE3 may include extensions CN_E1 and CN_E2 extended in the first direction DR1, and a first bridge CN_B1 connecting between the extensions CN_E1 and CN_E2. The first extension CN_E1 may be disposed on the second electrode RME2 such that it faces the first connection electrode CNE1 in the emission area EMA. In the first sub-pixel SPX1, the first extension CN_E1 may be disposed on the electrode branch RMB of the second electrode RME2 of the second electrode line RM2. The second extension CN_E2 may be disposed on the first electrode RME1 such that it faces the second connection electrode CNE2 in the emission area EMA. The first bridge CN_B1 may connect the first extension CN_E1 with the second extension CN_E2. The third connection electrode CNE3 may be disposed on the third bank layer BNL3 on the emission area EMA and may not be connected to or directly connected to the electrode RME. The second electrode RME2 disposed under or below the first extension CN_E1 may be electrically connected to the second voltage line VL2, and the second supply voltage applied to the second electrode RME2 may not be transmitted to the third connection electrode CNE3. The third connection electrode CNE3 may overlap the second bank portion BNL2 and the third bank portion BNL3.

The display device 10 may further include insulating layers PAS1, PAS2 and PAS3 disposed between the electrodes RME1 and RME2, the light-emitting elements ED, and the connection electrodes CNE1, CNE2 and CNE3. The electrodes RME1 and RME2, the light-emitting elements ED and the connection electrodes CNE1, CNE2 and CNE3 may be disposed such that they overlap one another and are only partially in contact with one another by the insulating layers PAS1, PAS2 and PAS3 disposed therebetween.

The cross-sectional shapes of the above-described bank portions BNL1, BNL2 and BNL3 may be different from one another. Detailed description thereof will be made below.

Figure 8:
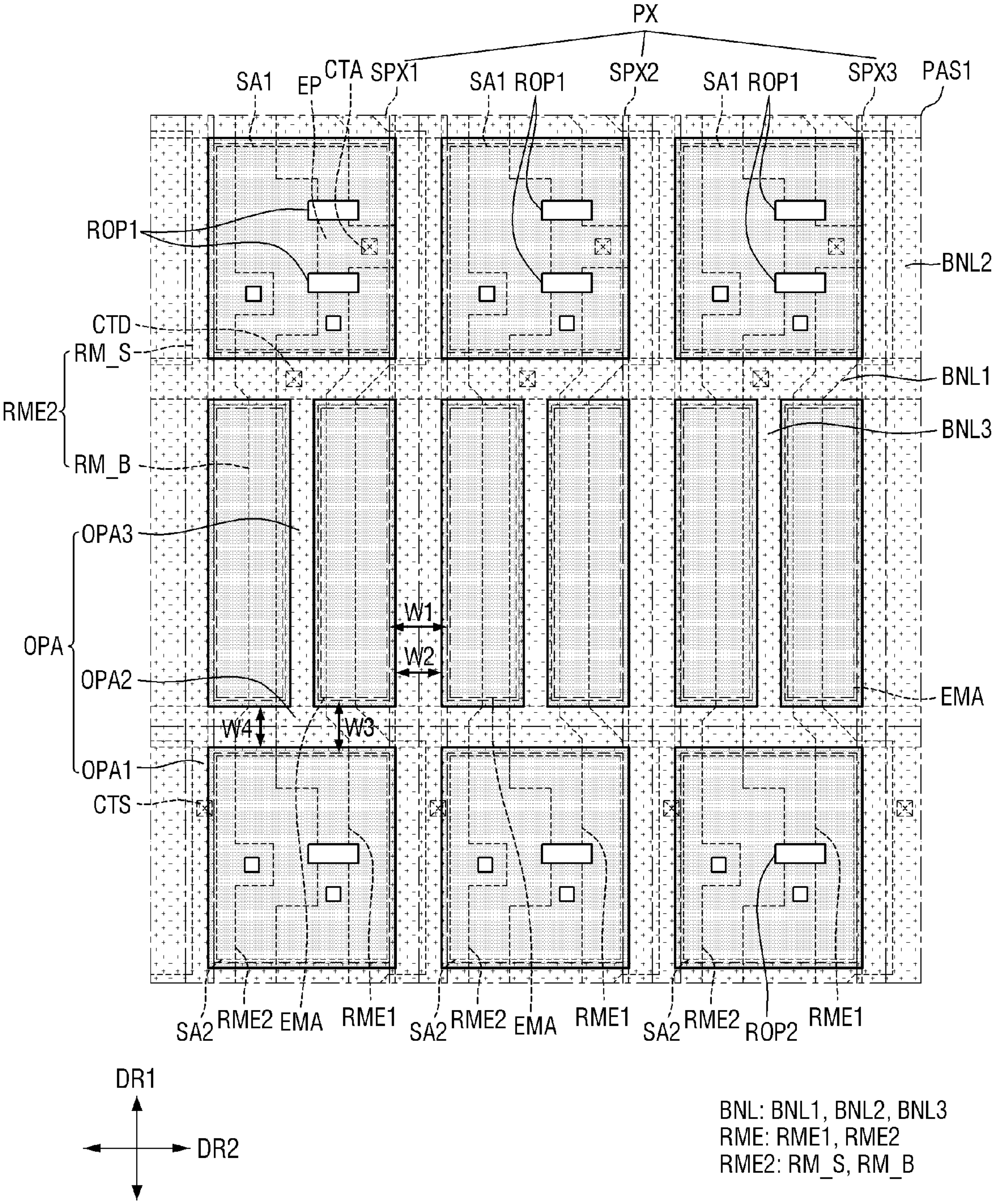
FIG. 8 is a schematic plan view showing an arrangement of a first insulating layer disposed in the pixel of FIG. 5.
Figure 9:
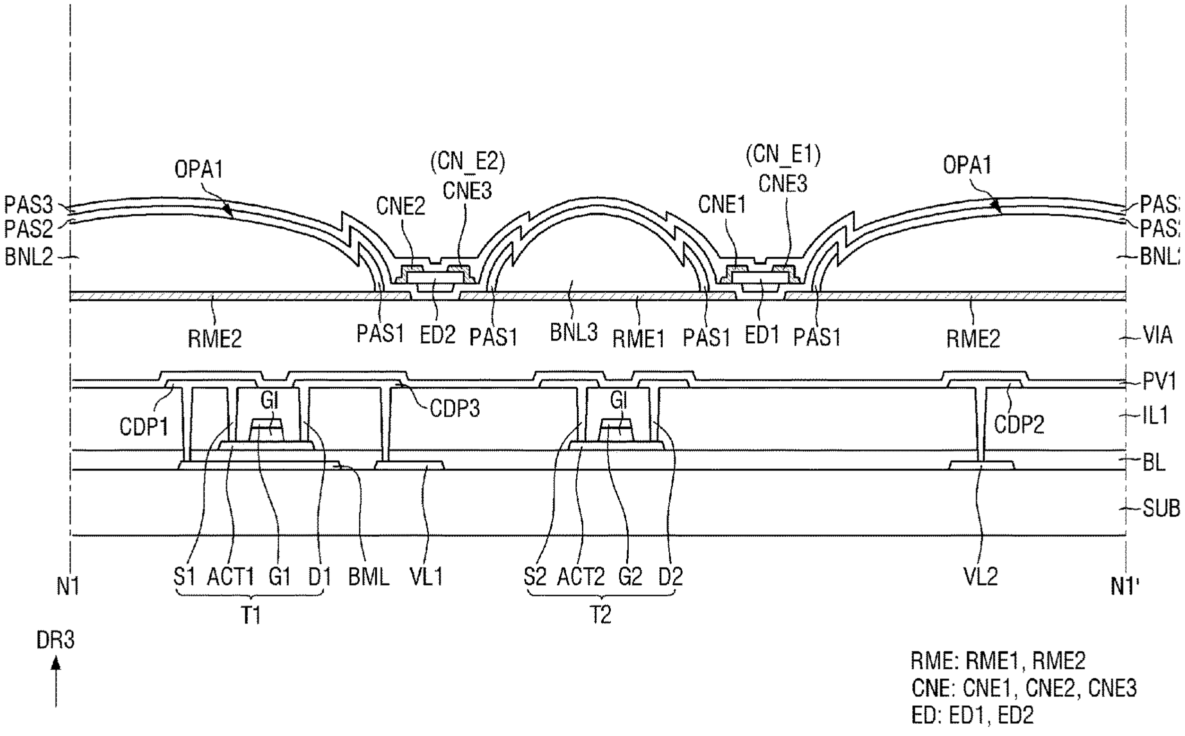
FIG. 9 is a schematic cross-sectional view taken along line N1-N1' of FIG. 5.
Figure 10:
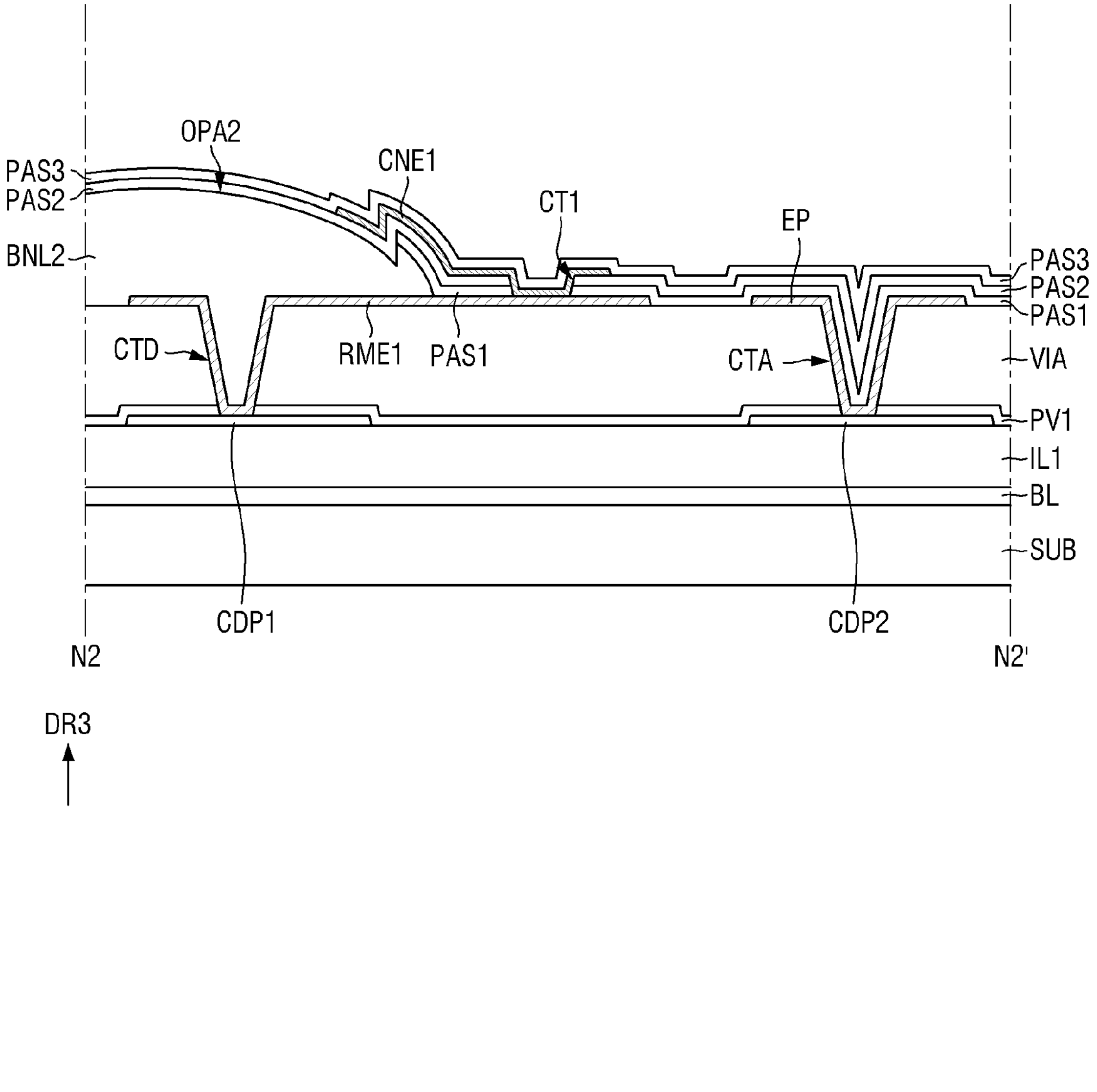
FIG. 10 is a schematic cross-sectional view taken along line N2-N2' of FIG. 5.
Figure 11:
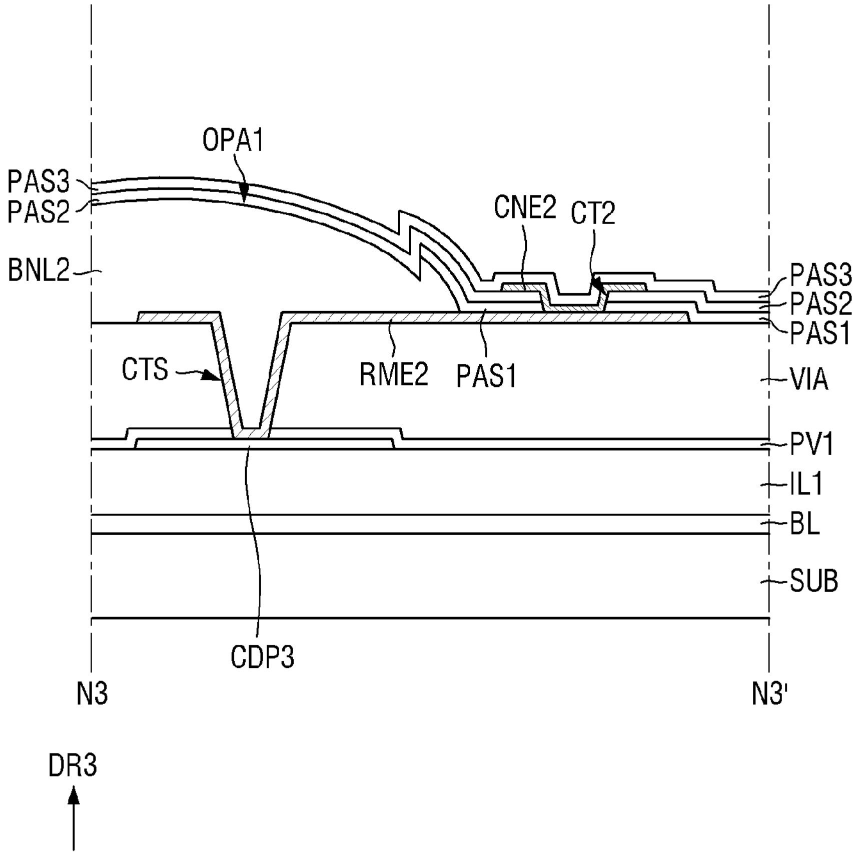
FIG. 11 is a schematic cross-sectional view taken along line N3-N3' of FIG. 5.
Figure 12:
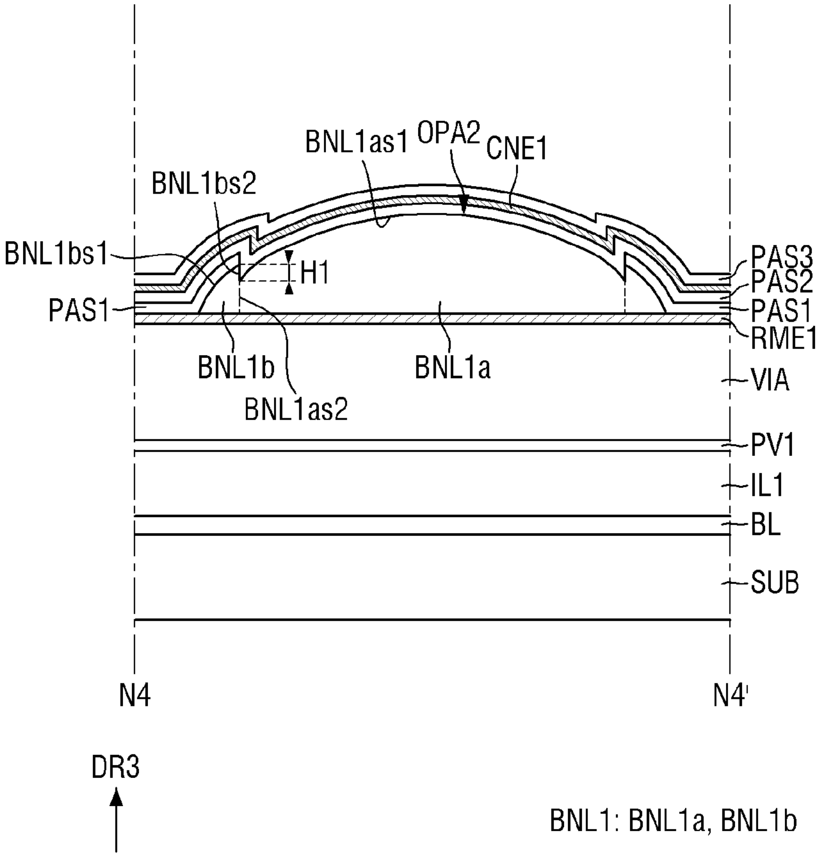
FIG. 12 is a schematic cross-sectional view taken along line N4-N4' of FIG. 5.
Figure 13:
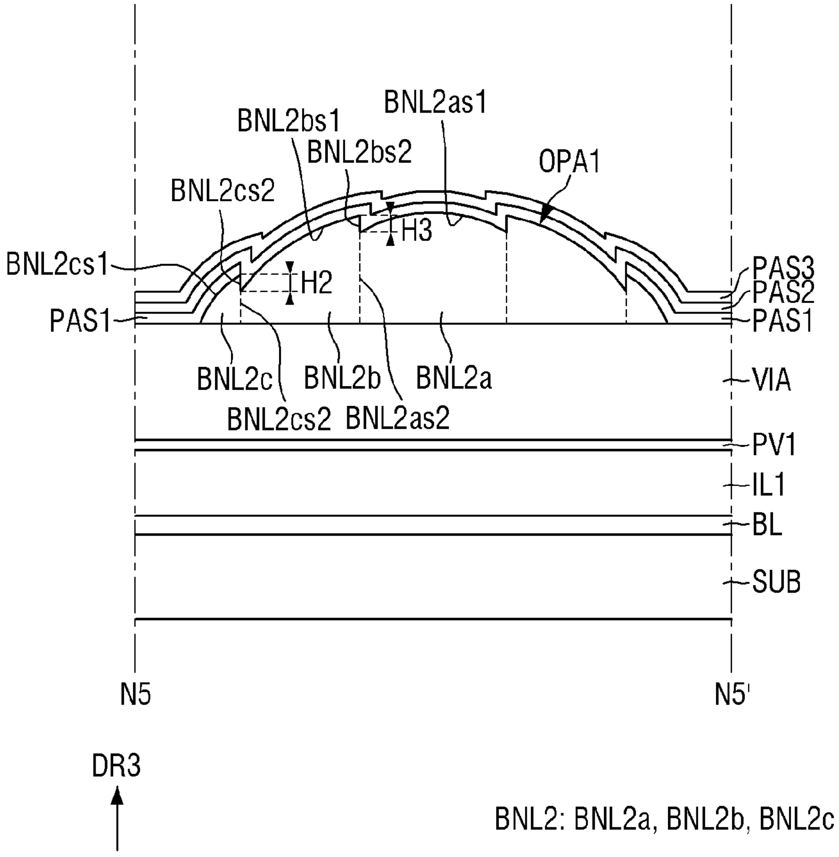
FIG. 13 is a c schematic cross-sectional view taken along line N5-N5' of FIG. 5.

FIG. 8 is a schematic plan view showing an arrangement of a first insulating layer disposed in the pixel of FIG. 5. FIG. 9 is a schematic cross-sectional view taken along line N1-N1' of FIG. 5. FIG. 10 is a schematic cross-sectional view taken along line N2-N2' of FIG. 5. FIG. 11 is a schematic cross-sectional view taken along line N3-N3' of FIG. 5. FIG. 12 is a schematic cross-sectional view taken along line N4-N4' of FIG. 5. FIG. 13 is a schematic cross-sectional view taken along line N5-N5' of FIG. 5.

The cross-sectional structure of the display device 10 will be described with reference to FIGS. 9 to 13 in conjunction with FIGS. 5 to 8. The display device 10 may include a first substrate SUB, and a semiconductor layer, conductive layers and insulating layers disposed on the first substrate SUB. The display device 10 may include electrodes RME: RME1 and RME2, light-emitting elements ED: ED1 and ED2, and connection electrodes CNE: CNE1, CNE2 and CNE3. The semiconductor layer, the conductive layers and the insulating layers may form a circuit layer of the display device 10.

The first substrate SUB may be an insulating substrate. The first substrate SUB may be made of an insulating material such as glass, quartz and a polymer resin. The first substrate SUB may be either a rigid substrate or a flexible substrate that can be bent, folded, or rolled. The first substrate SUB may include the display area DPA and the non-display area NDA surrounding the display area DPA. The display area DPA may include the emission area EMA and the subsidiary areas SA1 and SA2 which is a part of the non-emission area.

A first conductive layer may be disposed on the first substrate SUB. The first conductive layer may include a bottom metal layer BML, a first voltage line VL1, and a second voltage line VL2. The bottom metal layer BML may overlap a first active layer ACT1 of a first transistor T1. The bottom metal layer BML may prevent light from being incident on the first active layer ACT1 of the first transistor or may be electrically connected to the first active layer ACT1 to stabilize the electrical characteristics of the first transistor T1. It is, however, to be noted that the bottom metal layer BML may be eliminated.

A high-level voltage (or a first supply voltage) may be applied to the first voltage line VL1 to be transmitted to the first electrode RME1, and a low-level voltage (or a second supply voltage) may be applied to the second voltage line VL2 to be transmitted to the second electrode RME2. The first voltage line VL1 may be electrically connected to the first transistor T1 through a conductive pattern of the third conductive layer (for example, a third conductive pattern CDP3). The second voltage line VL2 may be electrically connected to the second electrode RME2 through a conductive pattern of the third conductive layer (for example, the second conductive pattern CDP2).

Although the first voltage line VL1 and the second voltage line VL2 are disposed on the first conductive layer in the example shown in the drawings, the disclosure is not limited thereto. In an embodiment, the first voltage line VL1 and the second voltage line VL2 may be disposed on the third conductive layer to be electrically connected directly or electrically connected to the first transistor T1 and the second electrode RME2, respectively.

A buffer layer BL may be disposed on the first conductive layer and the first substrate SUB. The buffer layer BL may be formed on the first substrate SUB to protect the transistors of the pixel PX from moisture permeating through the first substrate SUB that is susceptible to moisture permeation, and may also provide a flat surface.

The semiconductor layer is disposed on the buffer layer BL. The semiconductor layer may include the first active layer ACT1 of the first transistor T1 and the second active layer ACT2 of the second transistor T2. The first active layer ACT1 and the second active layer ACT2 may be disposed to partially overlap the first gate electrode G1 and the second gate electrode G2 of a second conductive layer, respectively, which will be described later.

The semiconductor layer may include polycrystalline silicon, monocrystalline silicon, an oxide semiconductor, etc., within the spirit and the scope of the disclosure. In other embodiments, the semiconductor layer may include polycrystalline silicon. The oxide semiconductor may be an oxide semiconductor containing indium (In). For example, the oxide semiconductor may be at least one of indium tin oxide (ITO), indium zinc oxide (IZO), indium gallium oxide (IGO), indium zinc tin oxide (IZTO), indium gallium tin oxide (IGTO), indium gallium zinc oxide (IGZO), indium-gallium zinc tin oxide (IGZTO), etc., within the spirit and the scope of the disclosure.

Although only one first transistor T1 is disposed in the sub-pixel SPXn of the display device 10 in the drawing, the disclosure is not limited thereto. A larger number of transistors may be included in the display device 10.

A first gate insulator GI is disposed on the semiconductor layer in the display area DPA. The first gate insulator GI may work as a gate insulating film of the transistors T1 and T2. In the example shown in the drawings, the first gate insulator GI is patterned together with the gate electrodes G1 and G2 of the second conductive layer to be described later, and is partially disposed between the second conductive layer and the active layers ACT1 and ACT2 of the semiconductor layer. It should be understood, however, that the disclosure is not limited thereto. In an embodiment, the first gate insulator GI may be disposed entirely on the buffer layer BL.

The second conductive layer is disposed on the first gate insulator GI. The second conductive layer may include a first gate electrode G1 of the first transistor T1, and a second gate electrode G2 of the second transistor T2. The first gate electrode G1 may overlap a channel region of the first active layer ACT1 in the third direction DR3, which is the thickness direction. The second gate electrode G2 may overlap a channel region of the second active layer ACT2 in the third direction DR3, which is the thickness direction. Although not shown in the drawings, the second conductive layer may further include an electrode of a storage capacitor.

A first interlayer dielectric layer IL1 is disposed on the second conductive layer. The first interlayer dielectric layer IL1 may work as an insulating film between the second conductive layer and other layers disposed thereon and can protect the second conductive layer.

The third conductive layer is disposed on the first interlayer dielectric layer IL1. The third conductive layer may include conductive patterns CDP1, CDP2 and CDP3, and source electrodes S1 and S2 and drain electrodes D1 and D2 of each of the transistors T1 and T2. Some or a number of the conductive patterns CDP1, CDP2 and CDP3 may electrically connect conductive layers or semiconductor layers of different layers with one another and may work as source or drain electrodes of the transistors T1 and T2.

The first conductive pattern CDP1 may be in contact with the first active layer ACT1 of the first transistor T1 through a contact hole penetrating the first interlayer dielectric layer IL1. The first conductive pattern CDP1 may be in contact with the bottom metal layer BML, through a contact hole penetrating the first interlayer dielectric film IL1 and the buffer layer BL. The first conductive pattern CD1 may work as a first source electrode S1 of the first transistor T1. The first conductive pattern CDP1 may be electrically connected to the first electrode RME1 or the first connection electrode CNE1. The first transistor T1 may transfer the first supply voltage applied from the first voltage line VL1 to the first electrode RME1 or the first connection electrode CNE1.

The second conductive pattern CDP2 may be in contact with the second voltage line VL2 through a contact hole penetrating the first interlayer dielectric film IL1 and the buffer layer BL. The second conductive pattern CDP2 may be electrically connected to the first electrode RME1 or the first connection electrode CNE1. The second voltage line VL2 may transfer the second supply voltage to the second electrode RME2 or the second connection electrode CNE2.

The third conductive pattern CDP3 may be in contact with the first voltage line VL1 through a contact hole penetrating the first interlayer dielectric film IL1 and the buffer layer BL. The third conductive pattern CDP3 may be in contact with the first active layer ACT1 of the first transistor T1 through a contact hole penetrating the first interlayer dielectric layer IL1. The third conductive pattern CDP3 may electrically connect the first voltage line VL1 with the first transistor T1 and may work as the first drain electrode D1 of the first transistor T1.

Each of the second source electrode S2 and the second drain electrode D2 may be in contact with the second active layer ACT2 of the second transistor T2 through contact holes penetrating the first interlayer dielectric film IL1. The second transistor T2 may transmit a data signal to the first transistor T1 or may transmit an initialization signal.

A first passivation layer PV1 is disposed over the third conductive layer. The first passivation layer PV1 may work as an insulating film between the third conductive layer and other layers and can protect the third conductive layer.

The buffer layer BL, the first gate insulating layer GI, the first interlayer dielectric layer IL1 and the first passivation layer PV1 may be made up of multiple inorganic layers stacked each other alternately. For example, the buffer layer BL, the first gate insulating layer GI, the first interlayer dielectric layer IL1 and the first passivation layer PV1 may be made up of a double layer in which inorganic layers including at least one of silicon oxide ($SiO_x$), silicon nitride ($SiN_x$) and silicon oxynitride ($SiO_xN_y$) may be stacked each other or multiple layers in which they may be alternately stacked each other. It is, however, to be understood that the disclosure is not limited thereto. The buffer layer BL, the first gate insulating layer GI, the first interlayer dielectric layer IL1 and the first passivation layer PV1 may be made up of a single inorganic layer including the above-described insulating material. In an embodiment, the first interlayer dielectric layer IL1 may be made of an organic insulating material such as polyimide (PI).

A via layer VIA is disposed on the third conductive layer in the display area DPA. The via layer VIA may include an organic insulating material, for example, an organic insulating material such as polyimide (PI), to provide a flat surface over the underlying conductive layers having different heights. It should be noted that the via layer VIA may be eliminated in some implementations.

The display device 10 may include the electrodes RME: RME1 and RME2, the bank layer BNL, the light-emitting elements ED, and the connection electrodes CNE: CNE1, CNE2 and CNE3 as a display element layer disposed on the via layer VIA. The display device 10 may include insulating layers PAS1, PAS2 and PAS3 disposed on the via layer VIA.

The electrodes RME: RME1 and RME2 may be disposed on the via layer VIA.

Each of the electrodes RME may be in direct contact with the third conductive layer through the electrode contact holes CTD and CTS where it overlaps the bank layer BNL. The first electrode contact hole CTD may be formed where the bank layer BNL disposed between the emission area EMA and the first subsidiary area SA1 overlaps the first electrode RME1. The second electrode contact hole CTS may be formed where the bank layer BNL disposed between the subsidiary areas SA1 and SA2 adjacent to each other in the second direction DR2 overlaps the electrode stem RM_S of the second electrode RME2. The first electrode RME1 may be in contact with the first conductive pattern CDP1 through the first electrode contact hole CTD penetrating through the via layer VIA and the first passivation layer PV1. The second electrode RME2 may be in contact with the second conductive pattern CDP2 through the second electrode contact hole CTS penetrating through the via layer VIA and the first passivation layer PV1. The first electrode RME1 may be electrically connected to the first transistor T1 through the first conductive pattern CDP1 to receive the first supply voltage. The second electrode RME2 may be electrically connected to the second voltage line VL2 through the second conductive pattern CDP2 to receive the second supply voltage. It is, however, to be understood that the disclosure is not limited thereto. According to an embodiment, each of the electrodes RME1 and RME2 may not be electrically connected to the voltage lines VL1 and VL2 of the third conductive layer and connection electrodes CNE to be described later may be connected to or directly connected to the third conductive layer.

The line connection electrode EP may be connected to the third conductive pattern CDP3 through a third electrode contact hole CTA penetrating the via layer VIA. The first electrode RME1 may be formed such that it is connected to the line connection electrode EP, and an electric signal applied to align the light-emitting elements ED may be applied to the first electrode RME1 from the first voltage line VL1 through the third conductive pattern CDP3 and the line connection electrode EP. In the process of aligning the light-emitting elements ED, a signal is applied to the first voltage line VL1 and the second voltage line VL2, and these are transmitted to the first electrode RME1 and the second electrode RME2, respectively.

The second electrode contact hole CTS may have a relative arrangement different from that of the third electrode contact hole CTA, which will be described later. The second electrode contact hole CTS may be located at a portion of the bank layer BNL that surrounds the second subsidiary area SA2, and the third electrode contact hole CTA may be disposed in the first subsidiary area SA1. Since the second electrode contact hole CTS and the third electrode contact hole CTA respectively expose the upper surfaces of different voltage lines VL1 and VL2, the positions of the electrode contact holes may be determined accordingly.

The electrodes RME may include a metal such as silver (Ag), copper (Cu) and aluminum (Al), or may include an alloy including aluminum (Al), nickel (Ni), lanthanum (La), or the like, or a stack of a metal layer such as titanium (Ti), molybdenum (Mo) and niobium (Nb) and the alloy. In an embodiment, the electrodes RME may be made up of a double- or multi-layer in which an alloy containing aluminum (Al) and at least one metal layer made of titanium (Ti), molybdenum (Mo) and niobium (Nb) may be stacked each other.

It is, however, to be understood that the disclosure is not limited thereto. The electrodes RME may further include a transparent conductive material. For example, each of the electrodes RME may include a material such as ITO, IZO and ITZO. In an embodiment, each of the electrodes RME1 and RME2 may have a structure in which one or more layers of a transparent conductive material and one or more metal layers having high reflectivity may be stacked each other, or may be made up of a single layer including them. For example, each of the electrodes RME may have a stack structure such as ITO/Ag/ITO/, ITO/Ag/IZO, or ITO/Ag/ITZO/IZO.

The bank layer BNL may be disposed on the first insulating layer PAS1. The bank layer BNL may include portions extended in the first direction DR1 and the second direction DR2 and may surround each of the sub-pixels SPXn. The bank layer BNL may surround the emission area EMA and the subsidiary areas SA1 and SA2 of each of the sub-pixels SPXn to distinguish between them, and may surround the border of the display area DPA to distinguish between the display area DPA and the non-display area NDA. A portion of the bank layer BNL extended in the first direction DR1 may separate the emission area EMA from the subsidiary areas SA1 and SA2, while a portion of the bank layer BNL extended in the second direction DR2 may separate adjacent sub-pixels SPXn. A portion of the bank layer BNL extended in the second direction DR2 may be disposed on the second bank pattern BNL2.

The bank layer BNL may have a height similar to the bank patterns BNL3 and BNL2. The bank layer BNL can prevent an ink from overflowing into adjacent sub-pixels SPXn during an inkjet printing process of the process of fabricating the display device 10. The bank layer BNL may include an organic insulating material such as polyimide.

The first bank portion BNL1 may include a (1-1) bank portion BNL1*a*, and a (1-2) bank portion BNL1*b* connected to the (1-1) bank portion BNL1*a* in the first direction DR1 and having the average height smaller than that of the (1-1) bank portion BNL1*a*. The second bank portion BNL2 may include a (2-1) bank portion BNL2*a*; a (2-2) bank portion BNL2*b* connected to the (2-1) bank portion BNL2*a* in the second direction DR2 and having the average height smaller than that of the (2-1) bank portion BNL2*a*; and a (2-3) bank portion BNL2*c* spaced apart from the (2-1) bank portion BNL2*a* with the (2-2) bank portion BNL2*b* therebetween and having the average height smaller than that of the (2-2) bank portion BNL2*b*. Since the cross-sectional shape of the third bank portion BNL3 is similar to that of the second bank portion BNL2; and, therefore, the redundant descriptions will be omitted.

The (1-1) bank portion BNL1*a* and the (1-2) bank portion BNL1*b* that is connected with the (1-1) bank portion BNL1*a* in the first direction DR1 and has the average height smaller than that of the (1-1) bank portion BNL1*a* may include upper surfaces BNL1*as*1 and BNL1*bs*1 and side surfaces BNL1*as*2 and BNL1*bs*2, respectively.

The side surface BNL1*as*2 of the (1-1) bank portion BNL1*a* and the side surface BNL1*bs*2 of the (1-2) bank portion BNL1*b* may be in contact with each other. It should be noted that the (1-1) bank portion BNL1*a* may expose the upper end of the side surface BNL1*bs*2 of the (1-2) bank portion BNL1*b*.

There may be (1-2) bank portions BNL1*b*, and the (1-2) bank portions BNL1*b* may be spaced apart from each other with the (1-1) bank portion BNL1*a* therebetween.

The (2-1) bank portion BNL2*a*, the (2-2) bank portion BNL2*b* and the (2-3) bank portion BNL2*c* may include upper surfaces BNL2*as*1, BNL2*bs*1 and BNL2*bs*1 and side surfaces BNL2*as*2, BNL2*bs*2 and BNL2*cs*2, respectively.

The side surface BNL2*as*2 of the (2-1) bank portion BNL2*a* and the side surface BNL2*bs*2 of the (2-2) bank portion BNL2*b* may be in contact with each other, and the side surface BNL2*bs*2 of the (2-2) bank portion BNL2*b* and the side surface BNL2*cs*2 of the (2-3) bank portion BNL2*c* may be in contact with each other.

It should be noted that the (2-1) bank portion BNL2*a* may expose the upper end of the side surface BNL2*bs*2 of the (2-2) bank portion BNL2*b*. The (2-2) bank portion BNL2*b* may expose the upper end of the side surface BNL2*cs*2 of the (2-3) bank portion BNL2*c*.

There may be (2-2) bank portions BNL2*b*, and the (2-2) bank portions BNL2*b* may be spaced apart from each other with the (2-1) bank portion BNL2*a* therebetween.

There may be (2-3) bank portions BNL2*c*, and the (2-3) bank portions BNL2*c* may be spaced apart from each other with the (2-1) bank portion BNL2*a* and the (2-2) bank portions BNL2*b* therebetween.

As shown in FIGS. 12 and 13, the length H1 of the upper end of the side surface BNL1*bs*2 of the (1-2) bank portion BNL1*b* exposed by the (1-1) bank portion BNL1*a* may be equal to the length H2 of the upper end of the side surface BNL2*cs*2 of the (2-3) bank portion BNL2*c* exposed by the (2-2) bank portion BNL2*b*. Moreover, the length H2 of the upper end of the side surface BNL2*cs*2 of the (2-3) bank portion BNL2*c* exposed by the (2-2) bank portion BNL2*b* may be smaller than the length H3 of the upper end of the side surface BNL2*bs*2 of the (2-2) bank portion BNL2*b* exposed by the (2-1) bank portion BNL2*a*.

The length H1 of the upper end of the side surface BNL1*bs*2 of the (1-2) bank portion BNL1*b* exposed by the (1-1) bank portion BNL1*a* is equal to the length H2 of the upper end of the side surface BNL2*cs*2 of the (2-3) bank portion BNL2*c* exposed by the (2-2) bank portion BNL2*b*, and the length H2 of the upper end of the side surface BNL2*cs*2 of the (2-3) bank portion BNL2*c* exposed by the (2-2) bank portion BNL2*b* is smaller than the length H3 of the upper end of the side surface BNL2*bs*2 of the (2-2) bank portion BNL2*b* exposed by the (2-1) bank portion BNL2*a* because of an process of etching the first insulating layer PAS1, which will be described later. By way of example, the process of etching the first insulating layer PAS1 may be carried out by placing a halftone mask such that a halftone mask region HTM (see FIGS. 21 and 22) is in line with the first insulating layer PAS1 on the (1-1) bank portion BNL1*a* and the (2-2) bank portion BNL2*b*, and a full-tone mask region FTM (see FIG. 22) is in line with the first insulating layer PAS1 on the (2-1) bank portion BNL2*a*. A more detailed description thereof will be made later with respect to a method of fabricating a display device.

The first insulating layer PAS1 may be disposed on the via layer VIA and the electrodes RME. The first insulating layer PAS1 may include an insulating material, and can protect the electrodes RME and can insulate different electrodes RME from each other.

According to the embodiment of the disclosure, the first insulating layer PAS1 may include separation openings formed in line with the separation regions ROP1 and ROP2, contacts CT1 and CT2, and first opening holes. The first insulating layer PAS1 may be disposed entirely on the via layer VIA, and the underlying layers may be partially exposed where the separation openings, the contacts CT1 and CT2, and the first opening holes are formed.

As the openings formed in the first insulating layer PAS1, the openings formed in line with the separation regions ROP1 and ROP2 of the subsidiary areas SA1 and SA2 may expose the via layer VIA disposed thereunder. A process of disconnecting the first electrodes RME1 may be performed in the separation openings of the first insulating layer PAS1. The first electrode RME1 extended in the first direction DR1 may be formed such that it is connected to a first electrode RME1 or a line connection electrode EP of another adjacent sub-pixel SPXn in the first direction DR1, and may be separated as the portions exposed by the separation openings of the first insulating layer PAS1 are etched. The separation openings of the first insulating layer PAS1 may be disposed to be in line with the separation regions ROP1 and ROP2 located between the first electrodes RME1 or between the first electrode RME1 and the line connection electrode EP.

The contacts CT1 and CT2 of the first insulating layer PAS1 may overlap different electrodes RME, respectively, in the subsidiary areas SA1 and SA2. For example, the contacts CT1 and CT2 may include first contacts CT1 disposed to overlap the first electrode RME1, and second contacts CT2 disposed to overlap the second electrode RME2. The first contact CT1 and the second contact CT2 may be located in the subsidiary areas SA1 and SA2. The first contact CT1 located in the first subsidiary area SA1 may be spaced apart from the first separation region ROP1 located on the lower side of the line connection electrode EP to be disposed on the first electrode RME1. The first contact CT1 located in the second subsidiary area SA2 may be spaced apart from the second separation region ROP2 to be disposed on the first electrode RME1 of another sub-pixel SPXn. The second contact CT2 may be located on a portion of the electrode stem RM_S of the second electrode RME2 that protrudes to the subsidiary areas SA1 and SA2.

The first contacts CT1 and the second contacts CT2 may penetrate the first insulating layer PAS1 to expose a part of the upper surface of the first electrode RME1 or the second electrode RME2 disposed thereunder. Each of the first contact CT1 and the second contact CT2 may further penetrate some or a number of the other insulating layers disposed on the first insulating layer PAS1. The electrodes RME exposed by the contacts CT1 and CT2 may be in contact with the connection electrodes CNE.

The first insulating layer PAS1 may overlap the (1-2) bank portion BNL1*b*, may not overlap the (1-1) bank portion BNL1*a*, may overlap the (2-3) bank portion BNL2*c*, and may not overlap the (2-1) bank portion BNL2*a* or the (2-2) bank portion BNL2*b*. For example, the first insulating layer PAS1 may include an open area OPA including a first open area OPA1 exposing the (2-1) bank portion BNL2*a* and the (2-2) bank portion BNL2*b*, and a second open area OPA2 exposing the (1-1) bank portion BNL1*a*. Furthermore, the first insulating layer PAS1 may further include a third open area OPA3 partially exposing the third bank portion BNL3. The first open area OPA1 may be extended in the first direction DR1, the second open area OPA2 may be extended in the second direction DR2, and the third open area OPA3 may be extended in the first direction DR1. The first open area OPA1 may overlap the second bank portion BNL2, the second open area OPA2 may overlap the first bank portion BNL1, and the third open area OPA3 may overlap the third bank portion BNL3. The widths of the open areas OPA1, OPA2 and OPA3 may be smaller than the widths of the bank portions BNL1, BNL2 and BNL3 that they overlap, respectively. For example, the width W2 of the first open area OPA1 may be smaller than the width W1 of the second bank portion BNL2, and the width W4 of the second open area OPA2 may be smaller than the width W3 of the first bank portion BNL1.

As described above, the process of etching the first insulating layer PAS1 may be carried out by placing a halftone mask such that a halftone mask region HTM (see FIGS. 21 and 22) is in line with the first insulating layer PAS1 on the (1-1) bank portion BNL1*a* and the (2-2) bank portion BNL2*b*, and a full-tone mask region FTM (see FIG. 22) is in line with the first insulating layer PAS1 on the (2-1) bank portion BNL2*a*. A part of the bank layer BNL under or below the first insulating layer PAS1 is etched together during the process of etching the first insulating layer PAS1. Therefore, the side surface of the first insulating layer PAS1 may be aligned with the side surface BNL1*bs*2 of the (1-2) bank portion BNL1*b* and the side surface BNL2*cs*2 of the (2-3) bank portion BNL2*c* in the thickness direction.

The upper surfaces BNL2*as*1 and BNL2*bs*1 of the bank portion BNL2*a* and BNL2*b* exposed by the first open area OPA1 and the upper surface BNL1*as*1 of the bank portion BNL1*a* exposed by the second open area OPA2 may be subjected to a surface treatment. The liquid repellency may be stronger on the upper surface BNL2*as*1 of the bank portion BNL2*a* which is exposed by the open area OPA1 than on the upper surface BNL2*bs*1 of the bank portion BNL2*b* which is covered by the open area OPA1 In case that the ink in which the light-emitting elements ED are dispersed is jetted by inkjet printing or nozzle printing, it is possible to guide the ink to flow to the emission areas EMA of the sub-pixels SPX1, SPX2 and SPX3 without being formed on the upper surface of the bank layer BNL.

Furthermore, for the first bank portion BNL1 overlapping the connection electrodes CNE in the display device 10 according to the embodiment, the halftone mask region HTM (see FIG. 21) of the halftone mask is placed above the (1-1) bank portion BNL1*a* during the process of etching the first insulating layer PAS1, so that the length H1 of the side surface BNL1*bs*2 of the (1-2) bank portion BNL1*b* exposed by the (1-1) bank portion BNL1*b* can be reduced during the process of etching the first insulating layer PAS1. In this manner, it is possible to prevent disconnection of the connection electrodes CNE disposed on the first bank portion BNL1.

Moreover, during the process of etching the first insulating layer PAS1, the full-tone mask region FTM (see FIG. 22) of the half-tone mask is placed above the first insulating layer PAS1 on the (2-1) bank portion BNL2*a*, so that the length H3 of the upper end of the side surface BNL2*bs*2 of the (2-2) bank portion BNL2*b* exposed by the (2-1) bank portion BNL2*a* is greater than the length H2 of the upper end of the side surface BNL2*cs*2 of the (2-3) bank portion BNL2*c* exposed by the (2-2) bank portion BNL2*b*. In case that the ink in which the light-emitting elements ED are dispersed is jetted by the inkjet printing or nozzle printing, the contact angle between the ink and the second bank portion BNL2 can be increased, and thus there is an advantage that the loading amount of the ink can be increased.

The light-emitting elements ED may be disposed in the emission area EMA. The light-emitting elements ED may be disposed on the first insulating layer PAS1 between the bank patterns BNL3 and BNL2. The direction in which the light-emitting elements ED are extended may be parallel to the upper surface of the first substrate SUB. As will be described later, the light-emitting elements ED may include semiconductor layers arranged in the extended direction. The semiconductor layers may be sequentially arranged along a direction parallel to the upper surface of the first substrate SUB. It should be understood, however, that the disclosure is not limited thereto. In case that the light-emitting elements ED have a different structure, semiconductor layers may be disposed in a direction perpendicular to the first substrate SUB.

The light-emitting diodes ED disposed in each of the sub-pixels SPXn may emit light of different wavelength bands depending on the material of the semiconductor layer. It is, however, to be understood that the disclosure is not limited thereto. The light-emitting diodes ED disposed in each of the sub-pixels SPXn may include the semiconductor layers made of a same material or a similar material and may emit light of a same color.

The light-emitting elements ED may be disposed on different electrodes RME. The both ends of the first light-emitting elements ED1 may be disposed on the first electrode RME1 and the electrode branch RM_B of the second electrode RME2. In the first sub-pixel SPX1, the first light-emitting elements ED1 may be disposed on the second electrode RME2 of the second electrode line RM2, and may be disposed on the right side of the first bank pattern BNL3 in the emission area EMA. The both ends of the second light-emitting elements ED2 may be disposed on the first electrode RME1 and the electrode branch RM_B of the second electrode RME2.

The light-emitting elements ED may be electrically connected to the electrodes RME and the conductive layers under or below the via layer VIA in contact with the connection electrodes CNE: CNE1, CNE2 and CNE3, and an electric signal may be applied to it so that light of a given wavelength range can be emitted.

The second insulating layer PAS2 may be disposed on the light-emitting elements ED, the first insulating layer PAS1 and the bank layer BNL. The second insulating layer PAS2 may be in direct contact with the upper surface of the bank layer BNL exposed by the open areas OPA1 and OPAS2.

The connection electrodes CNE: CNE1, CNE2 and CNE3 may be disposed on the electrodes RME and the bank layer BNL.

The first connection electrode CNE1 may be disposed on the first electrode RME1. The first connection electrode CNE1 may partially overlap the first electrode RME1 and may be disposed from the emission area EMA to the subsidiary areas SA1 and SA2 beyond the bank layer BNL. The second connection electrode CNE2 may be disposed on the second electrode RME2. The second connection electrode CNE2 may partially overlap the second electrode RME2 and may be disposed from the emission area EMA to the subsidiary areas SA1 and SA2 beyond the bank layer BNL.

The third connection electrode CNE3 may be disposed across the emission area EMA and the bank BNL. The first extension CN_E1 may be disposed on the second electrode RME2 of the second electrode line RM2, and the second extension CN_E2 may be disposed on the first electrode RME1. The first bridge CN_B1 may be disposed on the bank layer BNL.

Each of the first connection electrode CNE1, the second connection electrode CNE2 and the third connection electrode CNE3 may be disposed on the second insulating layer PAS2 and may be in contact with the light-emitting elements ED. The first connection electrode CNE1 may be in contact with the first ends of the first light-emitting elements ED1. The second connection electrode CNE2 may be in contact with the second ends of the second light-emitting elements ED2. The first extension CN_E1 of the third connection electrode CNE3 may be in contact with the second ends of the first light-emitting elements ED1, and the second extension CN_E2 thereof may be in contact with the first ends of the second light-emitting elements ED2.

The connection electrodes CNE may include a conductive material. For example, they may include ITO, IZO, ITZO, aluminum (Al), etc., within the spirit and the scope of the disclosure. For example, the connection electrodes CNE may include a transparent conductive material, and lights emitted from the light-emitting elements ED may transmit the connection electrodes CNE to exit.

The third insulating layer PAS3 may be disposed on the connection electrodes CNE.

The first connection electrode CNE1 may be in contact with the first electrode RME1 through the first contact CT1 located in the subsidiary areas SA1 and SA2, and the second connection electrode CNE2 may be in contact with the second electrode RME2 through the second contact CT2 located in the subsidiary areas SA1 and SA2.

In the sub-pixel SPXn, the first connection electrode CNE1 and the second connection electrode CNE2 may be in contact with the electrodes RME1 and RME2, respectively, in the first subsidiary areas SA1 and SA2 in which the line connection electrodes EP are disposed. On the other hand, in another sub-pixel SPXn that is adjacent to the sub-pixel SPXn on the lower side in the first direction DR1, the first connection electrode CNE1 and the second connection electrode CNE2 may be in contact with the electrode RME1 and RME2 in the second subsidiary area SA2 where no line connection electrode EP is disposed.

The first connection electrode CNE1 may be electrically connected to the first transistor T1 to apply the first supply voltage, and the second connection electrode CNE2 may be electrically connected to the second voltage line VL2 to apply the second supply voltage. The first connection electrode CNE1 and the second connection electrode CNE2 may be in contact with the light-emitting elements ED in the emission area EMA to transmit the supply voltage to the light-emitting elements ED.

On the other hand, the third connection electrode CNE3 may not be directly connected to the electrodes RME. The second electrode RME2 disposed under or below the first extension CN_E1 may be electrically connected to the second voltage line VL2, and the second supply voltage applied to the second electrode RME2 may not be directly transmitted to the third connection electrode CNE3. The third connection electrode CNE3 may be electrically connected to the first connection electrode CNE1 and the second connection electrode CNE2 through the light-emitting elements ED.

Figure 14:
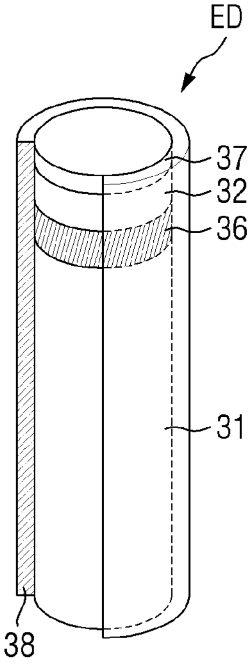
FIG. 14 is a view showing a light-emitting element according to an embodiment.
Figure 15:
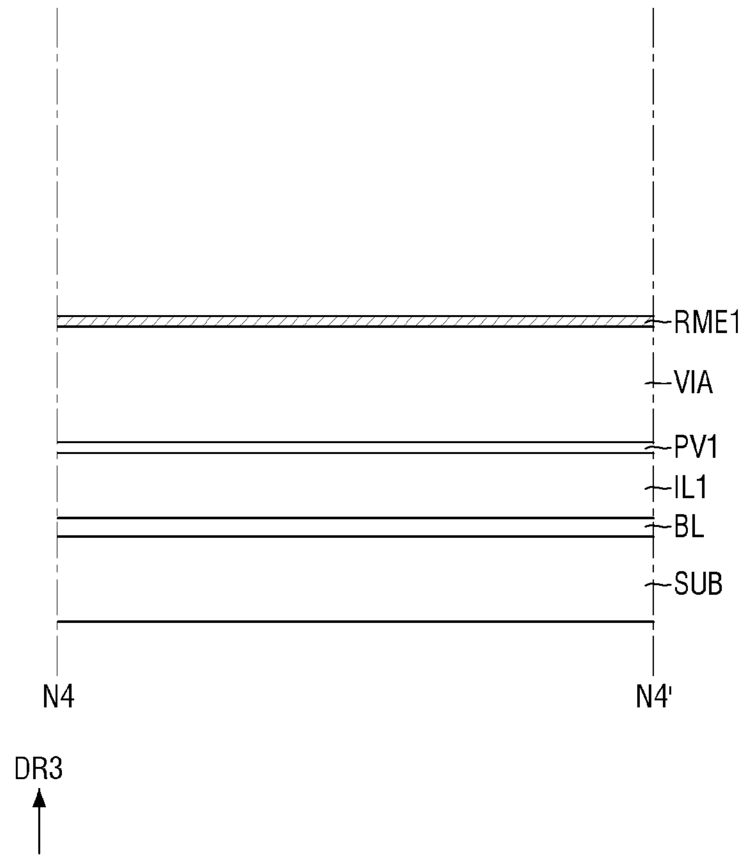
FIGS. 15 to 27 are schematic cross-sectional views showing processing steps of a method of fabricating a display device according to an embodiment.
Figure 16:
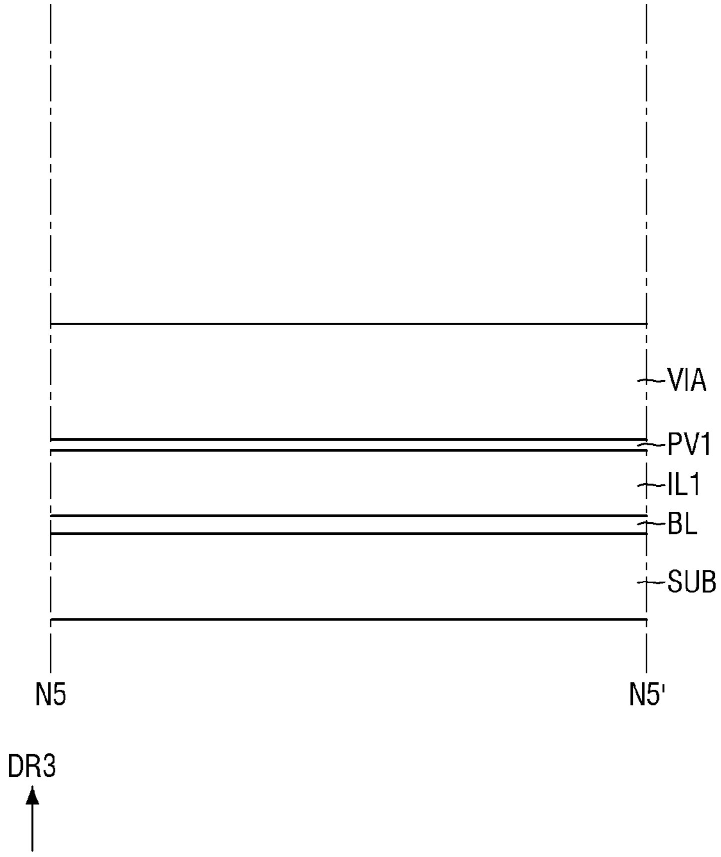

FIG. 14 is a view showing a light-emitting element according to an embodiment of the disclosure.

Referring to FIG. 14, a light-emitting element ED may be a light-emitting diode. By way of example, the light-emitting element ED may have a size from nanometers to micrometers and may be an inorganic light-emitting diode made of an inorganic material. The light-emitting diode ED may be aligned between two electrodes facing each other as polarities are created by forming an electric field in a given direction between the two electrodes.

The light-emitting diode ED according to an embodiment may have a shape extended in one direction or a direction. The light-emitting element ED may have a shape of a cylinder, a rod, a wire, a tube, etc., within the spirit and the scope of the disclosure. It is to be understood that the shape of the light-emitting diode ED is not limited thereto. The light-emitting diode ED may have a variety of shapes including a polygonal column shape such as a cube, a cuboid and a hexagonal column, or a shape that is extended in a direction with partially inclined outer surfaces.

The light-emitting diode ED may include semiconductor layers doped with a dopant of a conductive type (for example, p-type or n-type). The semiconductor layers may emit light of a given wavelength band by transmitting an electric signal applied from an external power source. The light-emitting diode ED may include a first semiconductor layer 31, a second semiconductor layer 32, an emissive layer 36, an electrode layer 37, and an insulating film 38.

The first semiconductor layer 31 may be an n-type semiconductor. The first semiconductor layer 31 may include a semiconductor material having the following chemical formula: $Al_xGa_yIn_{1-x-y}N$ ($0 \le x \le 1$, $0 \le y \le 1$, $0 \le x+y \le 1$). For example, the first semiconductor layer 31 may be one or more of AlGaInN, GaN, AlGaN, InGaN, AlN and InN doped with n-type dopant. The n-type dopant doped into the first semiconductor layer 31 may be Si, Ge, Sn, Se, etc., within the spirit and the scope of the disclosure.

The second semiconductor layer 32 is disposed above the first semiconductor layer 31 with the emissive layer 36 therebetween. The second semiconductor layer 32 may be a p-type semiconductor, and may include a semiconductor material having the following chemical formula: $Al_xGa_yIn_{1-x-y}N$ ($0 \le x \le 1$, $0 \le y \le 1$, $0 \le x+y \le 1$). For example, the second semiconductor layer 32 may be one or more of AlGaInN, GaN, AlGaN, InGaN, AlN and InN doped with p-type dopant. The p-type dopant doped into the second semiconductor layer 32 may be Mg, Zn, Ca, Ba, etc., within the spirit and the scope of the disclosure.

Although each of the first semiconductor layer 31 and the second semiconductor layer 32 is implemented as a signal layer in the drawings, the disclosure is not limited thereto. Depending on the material of the emissive layer 36, the first semiconductor layer 31 and the second semiconductor layer 32 may further include a larger number of layers, for example, a clad layer or a tensile strain barrier reducing (TSBR) layer. For example, the light-emitting elements ED may further include another semiconductor layer disposed between the first semiconductor layer 31 and the emissive layer 36 or between the second semiconductor layer 32 and the emissive layer 36. The semiconductor layer disposed between the first semiconductor layer 31 and the emissive layer 36 may be one or more of AlGaInN, GaN, AlGaN, InGaN, AlN, InN and SLs doped with an n-type dopant. The semiconductor layer disposed between the second semiconductor layer 32 and the emissive layer 36 may be one or more of AlGaInN, GaN, AlGaN, InGaN, AlN, and InN doped with a p-type dopant.

The emissive layer 36 is disposed between the first semiconductor layer 31 and the second semiconductor layer 32. The emissive layer 36 may include a material having a single or multiple quantum well structure. In case that the emissive layer 36 may include a material having the multiple quantum well structure, the structure may include quantum layers and well layers alternately stacked each other. The emissive layer 36 may emit light as electron-hole pairs are combined therein in response to an electrical signal applied through the first semiconductor layer 31 and the second semiconductor layer 32. The emissive layer 36 may include a material such as AlGaN, AlGaInN, and InGaN. In case that the emissive layer 36 has a multi-quantum well structure in which quantum layers and well layers are alternately stacked each other, the quantum layers may include AlGaN or AlGaInN, and the well layers may include a material such as GaN and AlGaN.

The emissive layer 36 may have a structure in which a semiconductor material having a large band gap energy and a semiconductor material having a small band gap energy are alternately stacked each other, and may include other Group III to Group V semiconductor materials depending on the wavelength range of the emitted light. Accordingly, the light emitted from the emissive layer 36 is not limited to the light of the blue wavelength band. The emissive layer 36 may emit light of red or green wavelength band in some implementations.

The electrode layer 37 may be an ohmic connection electrode. It is, however, to be understood that the disclosure is not limited thereto. The electrode layer 37 may be a Schottky connection electrode. The light-emitting diode ED may include at least one electrode layer 37. The light-emitting diode ED may include one or more electrode layers 37. It is, however, to be understood that the disclosure is not limited thereto. The electrode layer 37 may be eliminated.

The electrode layer 37 can reduce the resistance between the light-emitting element ED and the electrodes or the connection electrodes in case that the light-emitting element ED is electrically connected to the electrodes or the connection electrodes in the display device 10. The electrode layer 37 may include a metal having conductivity. For example, the electrode layer 37 may include at least one of aluminum (Al), titanium (Ti), indium (In), gold (Au), silver (Ag), ITO, IZO and ITZO.

The insulating film 38 is disposed to surround the outer surfaces of the semiconductor layers and electrode layers described above. For example, the insulating film 38 may be disposed to surround at least the outer surface of the emissive layer 36, with both ends of the light-emitting element ED in the longitudinal direction exposed. A part of the upper surface of the insulating film 38 may be rounded in cross section, which is adjacent to at least one of the ends of the light-emitting diode ED.

The insulating film 38 may include materials having insulating properties, for example, at least one of: silicon oxide ($SiO_x$), silicon nitride ($SiN_x$), silicon oxynitride ($SiO_xN_y$), aluminum nitride ($AlN_x$), aluminum oxide ($AlO_x$), zirconium oxide (ZrOx), hafnium oxide ($HfO_x$), and titanium oxide ($TiO_x$). Although the insulating film 38 is formed as a single layer in the drawings, the disclosure is not limited thereto. In an embodiment, the insulating film 38 may be made up of a multilayer structure in which multiple layers may be stacked each other.

The insulating film 38 can protect the semiconductor layers and the electrode layer of the light-emitting elements ED. The insulating film 30 can prevent an electrical short-circuit that may occur in the emissive layer 36 if it comes in direct contact with an electrode through which an electric signal is transmitted to the light-emitting diode ED. The insulating film 38 can prevent a decrease in luminous efficiency.

The outer surface of the insulating film 38 may be subjected to surface treatment. The light-emitting elements ED may be dispersed in an ink, and the ink may be sprayed onto the electrode. In doing so, a surface treatment may be applied to the insulating film 38 so that it becomes hydrophobic or hydrophilic in order to keep the light-emitting diodes ED dispersed in the ink from being aggregated with one another.

Hereinafter, a method of fabricating the display device 10 will be described.

FIGS. 15 to 27 are schematic cross-sectional views showing processing steps of a method of fabricating a display device according to an embodiment.

Hereinafter, processing steps of a method of fabricating the display device 10 will be described with reference to the schematic cross-sectional views of FIGS. 15 to 27 in conjunction with FIGS. 1 to 13.

Initially, referring to FIGS. 1 to 8 and FIGS. 15 and 16, in sub-pixels SPX1, SPX2 and SPX3 on a substrate SUB in which sub-pixels SPX1, SPX2 and SPX3 is defined, a first electrode RME1 extended in the first direction DR1 and a second electrode RME2 extended in the first direction DR1 and spaced apart from the first electrode RME1 in the second direction DR2 are formed.

A method of forming a buffer layer BL and other elements between the substrate SUB and the electrodes RME1 and RME2 will not be described herein.

Figure 17:
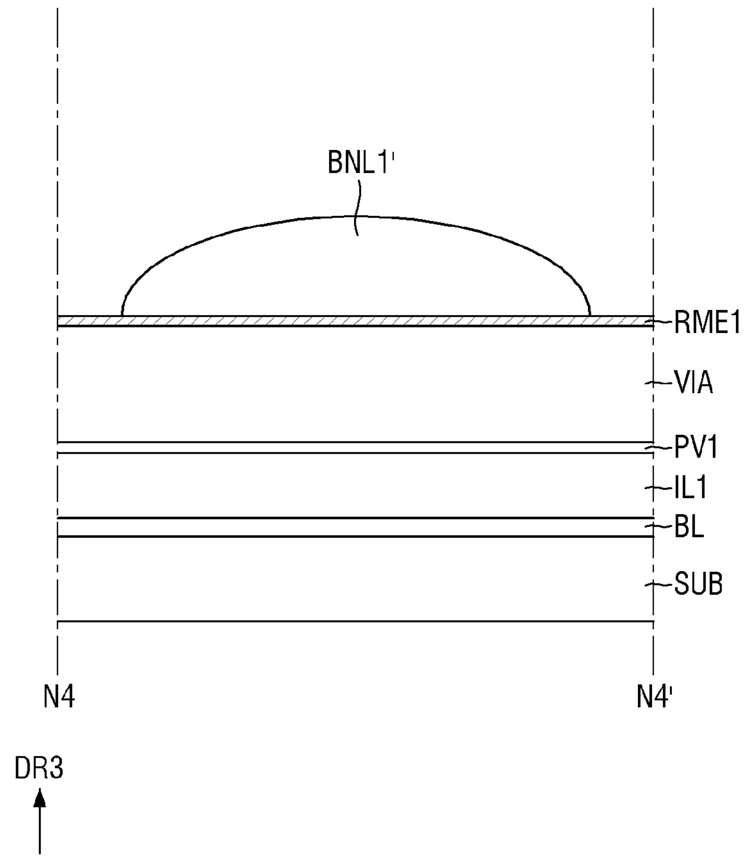
Figure 18:
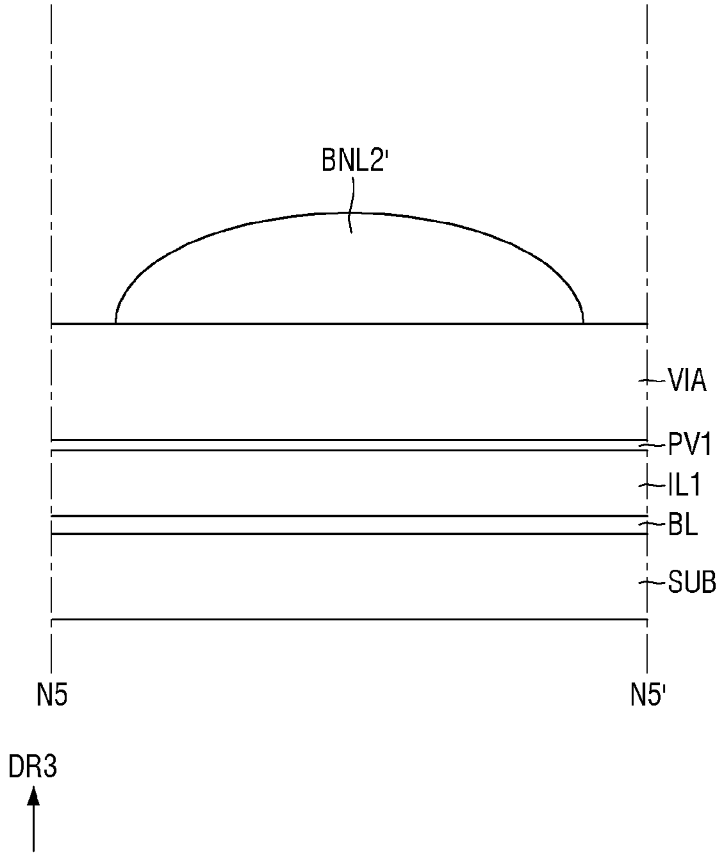

Subsequently, referring to FIGS. 1 to 8 and FIGS. 17 and 18, a bank layer is formed on a via layer VIA and the electrodes RME1 and RME2. FIG. 17 shows a first bank portion BNL1' on the first electrode RME1, and FIG. 18 shows a second bank portion BNL2' on the via layer VIA.

Figure 19:
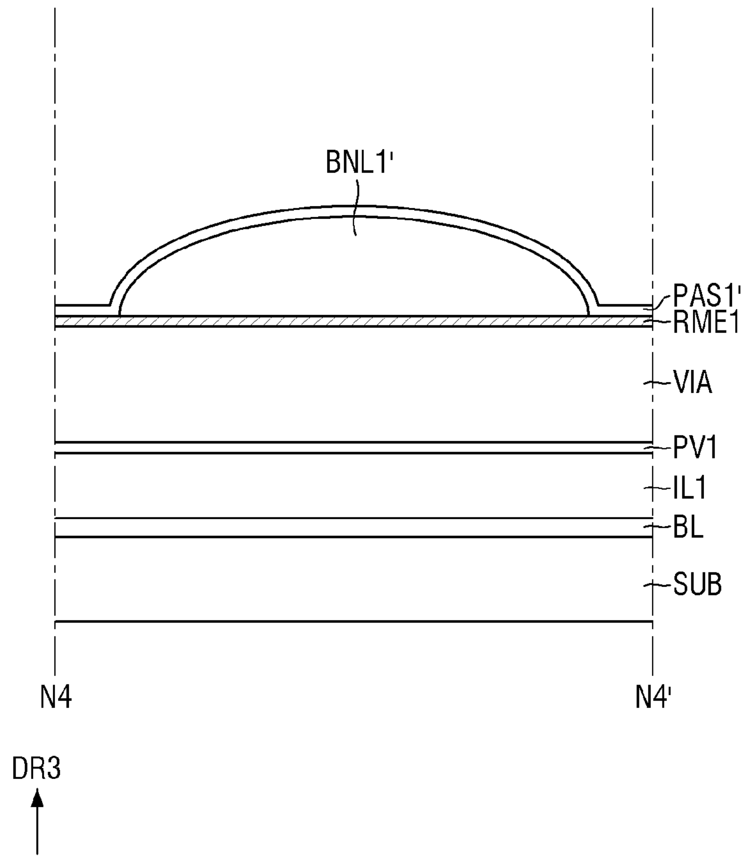
Figure 20:
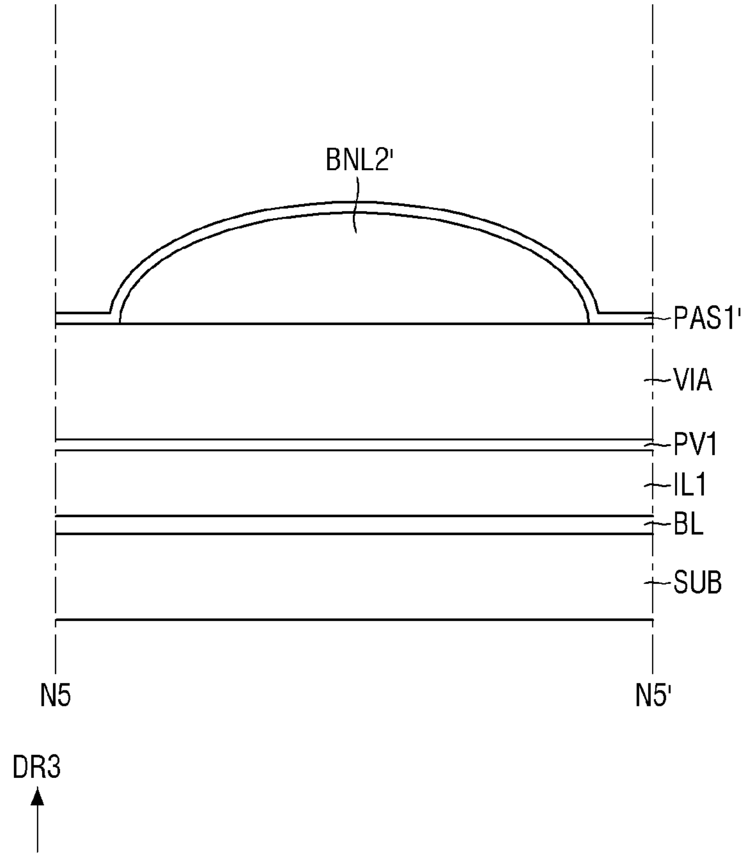

Subsequently, referring to FIGS. 1 to 8 and FIGS. 19 and 20, a first insulating layer PAS1' is formed on the bank layer. FIG. 19 shows a first insulating layer PAS1' on the first bank portion BNL1', and FIG. 20 shows the first insulating layer PAS1' on the second bank portion BNL2'.

Figure 21:
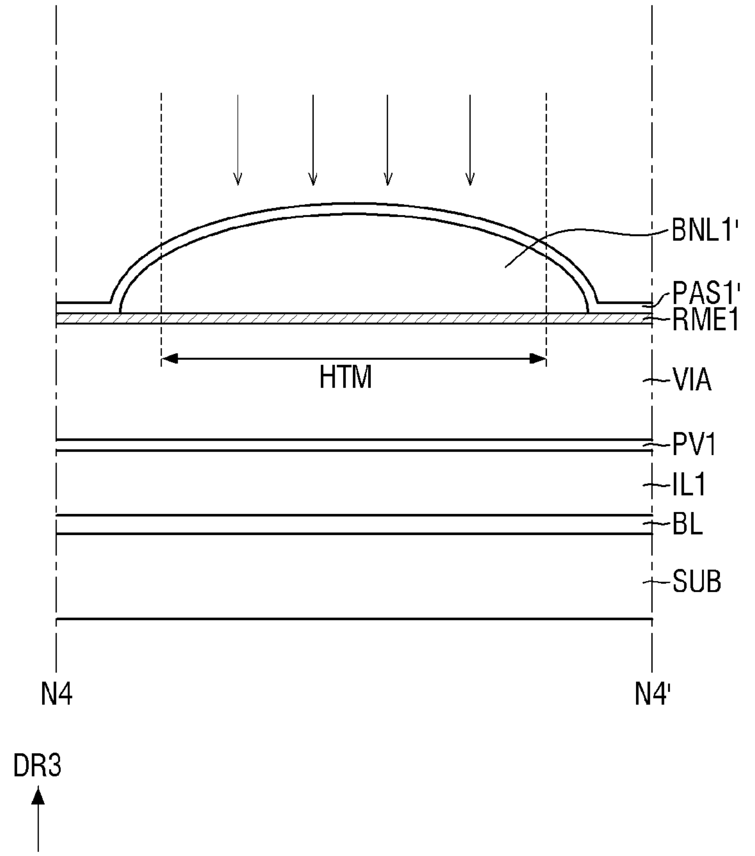
Figure 22:
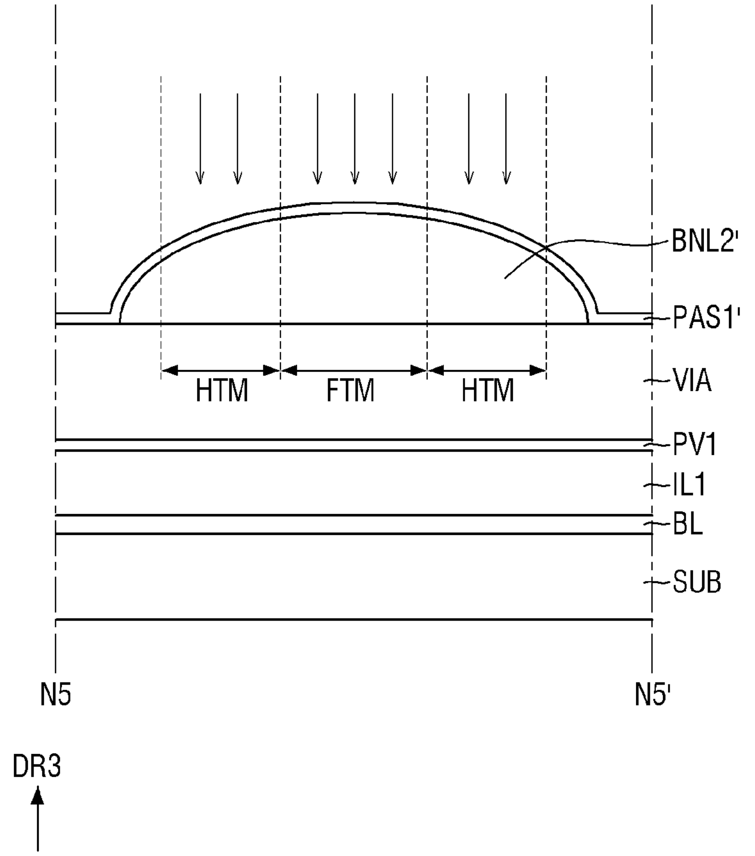
Figure 23:
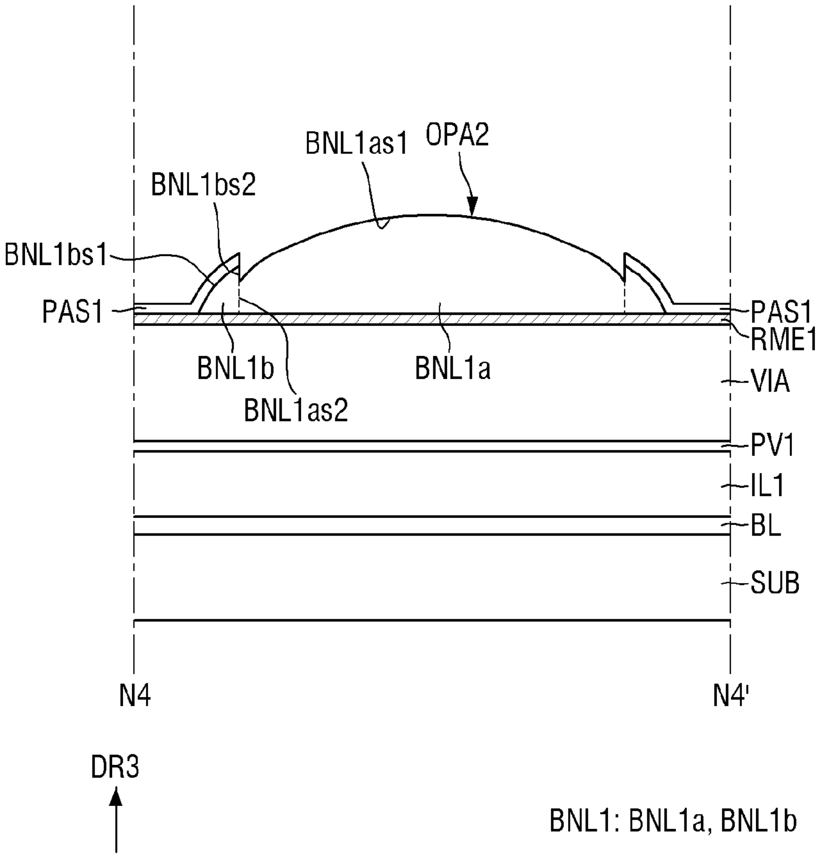
Figure 24:
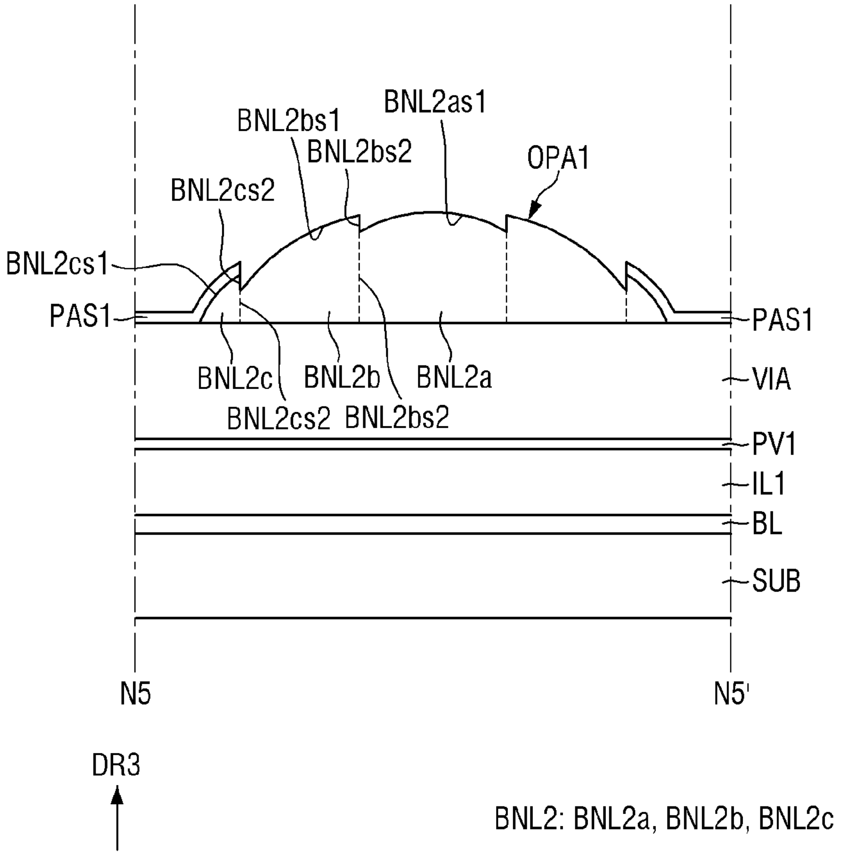
Figure 25:
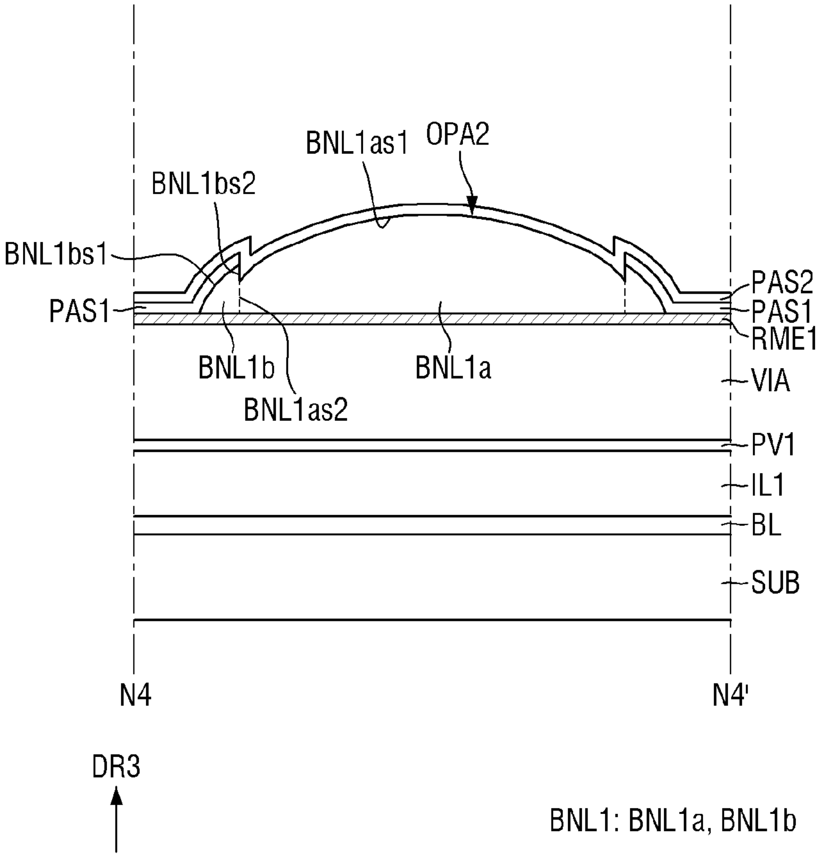
Figure 26:
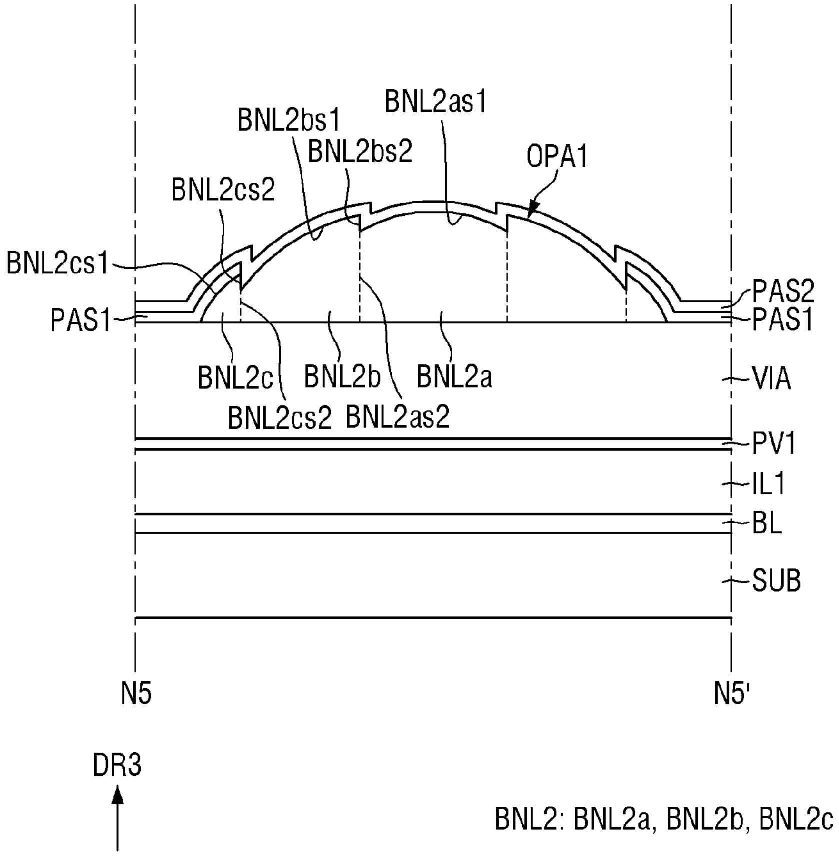

Subsequently, referring to FIGS. 1 to 8 and FIGS. 21 and 22, a process of etching the first insulating layer PAS1' is carried out. The etching process may be, for example, a dry etching process, but the disclosure is not limited thereto. As shown in FIGS. 21 and 22, the etching process may be carried out by placing a halftone mask region HTM of a halftone mask above a first insulating layer PAS1' on the (1-1) bank portion BNL1*a* and the (2-2) bank portion BNL2*b* of FIGS. 23 and 24, and by placing a full-tone mask region FTM of the halftone mask above the first insulating layer PAS1' on the (2-1) bank portion BNL2*a* of FIG. 24. In this manner, a first insulating layer PAS1 including the open areas OPA1 and OPA2 of FIGS. 23 and 24 can be formed.

Subsequently, referring to FIGS. 1 to 8 and FIGS. 25 and 26, a second insulating layer PAS2 is formed. The second insulating layer PAS2 may be disposed on the first insulating layer PAS1 and the bank layer BNL. The second insulating layer PAS2 may be in direct contact with the upper surfaces BNL1*as*1, BNL2*as*1, and BNL2*bs*1 of the bank layer BNL exposed by the open areas OPA1 and OPAS2.

Figure 27:
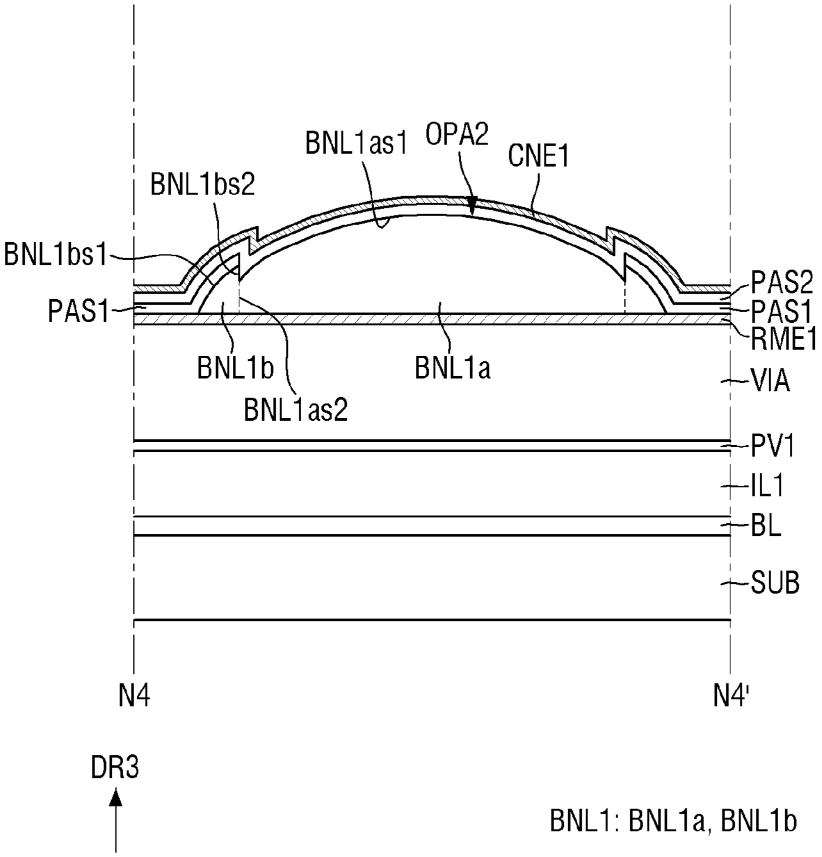

Subsequently, as shown in FIGS. 1 to 8 and 27, connection electrodes CNE are formed on the second insulating layer PAS2. FIG. 27 shows a first connection electrode CNE1 overlapping the first bank part BNL1.

Hereinafter, display devices according to a variety of embodiments of the disclosure will be described with reference to other drawings.

Figure 28:
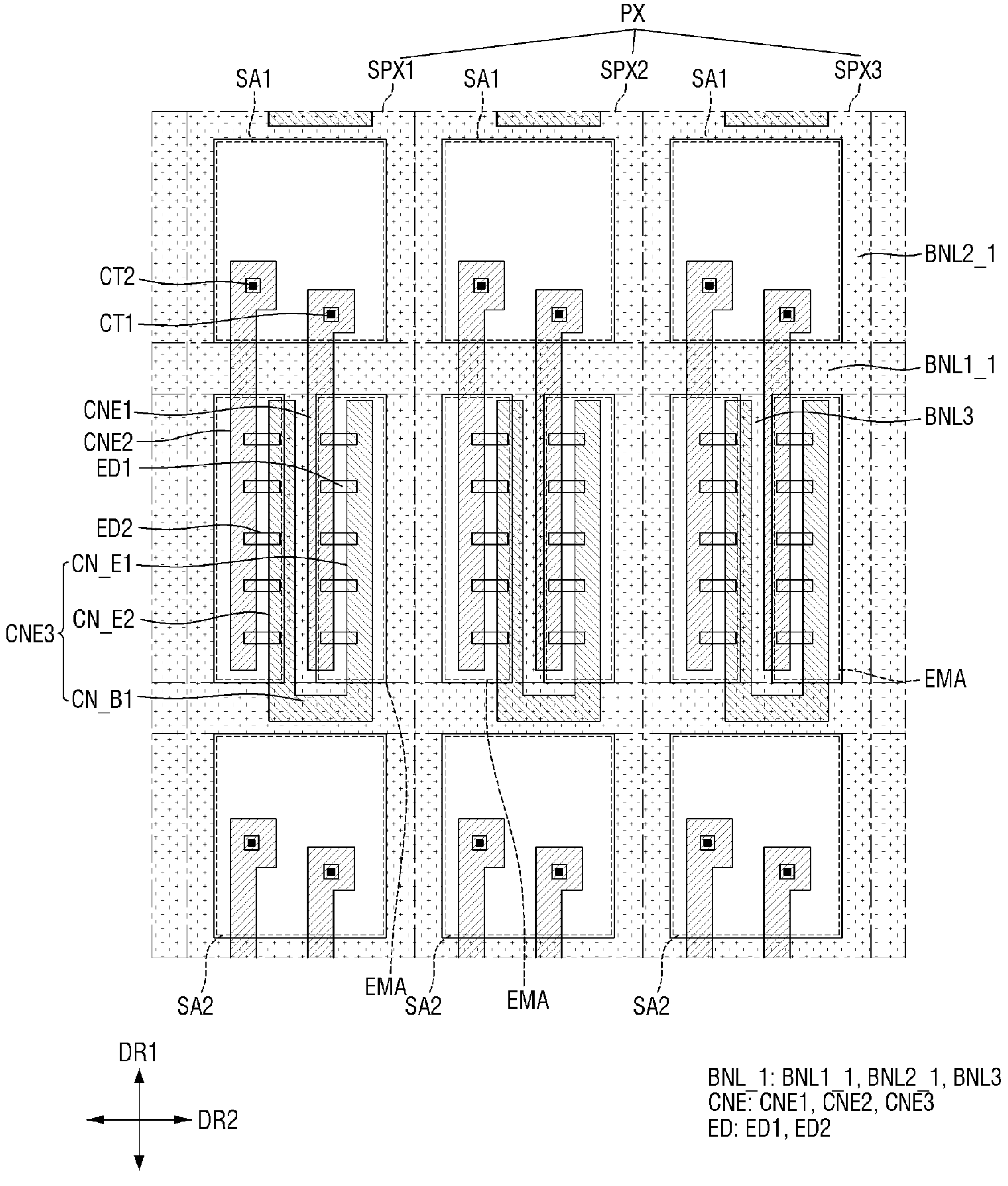
FIG. 28 is a schematic plan view showing an arrangement of a bank layer according to an embodiment.

FIG. 28 is a schematic plan view showing an arrangement of a bank layer according to an embodiment.

The embodiment of FIG. 28 is substantially identical to the embodiment of FIGS. 5 to 8 except that a first bank portion BNL1_1 of a bank layer BNL_1 in a display device is extended along the second direction DR2, a second bank portion BNL2_1 is extended along the first direction DR1, one end or an end of the second bank portion BNL2_1 in the first direction DR1 is connected to the first bank portion BNL1_1 located on one side or a side of the second bank portion BNL2_1 in the first direction DR1, and the opposite end of the second bank portion BNL2_1 in the first direction DR1 is connected to the first bank portion BNL1_1 located on the opposite side of the second bank portion BNL2_1 in the first direction DR1; and, therefore, the redundant descriptions will be omitted.

Figure 29:
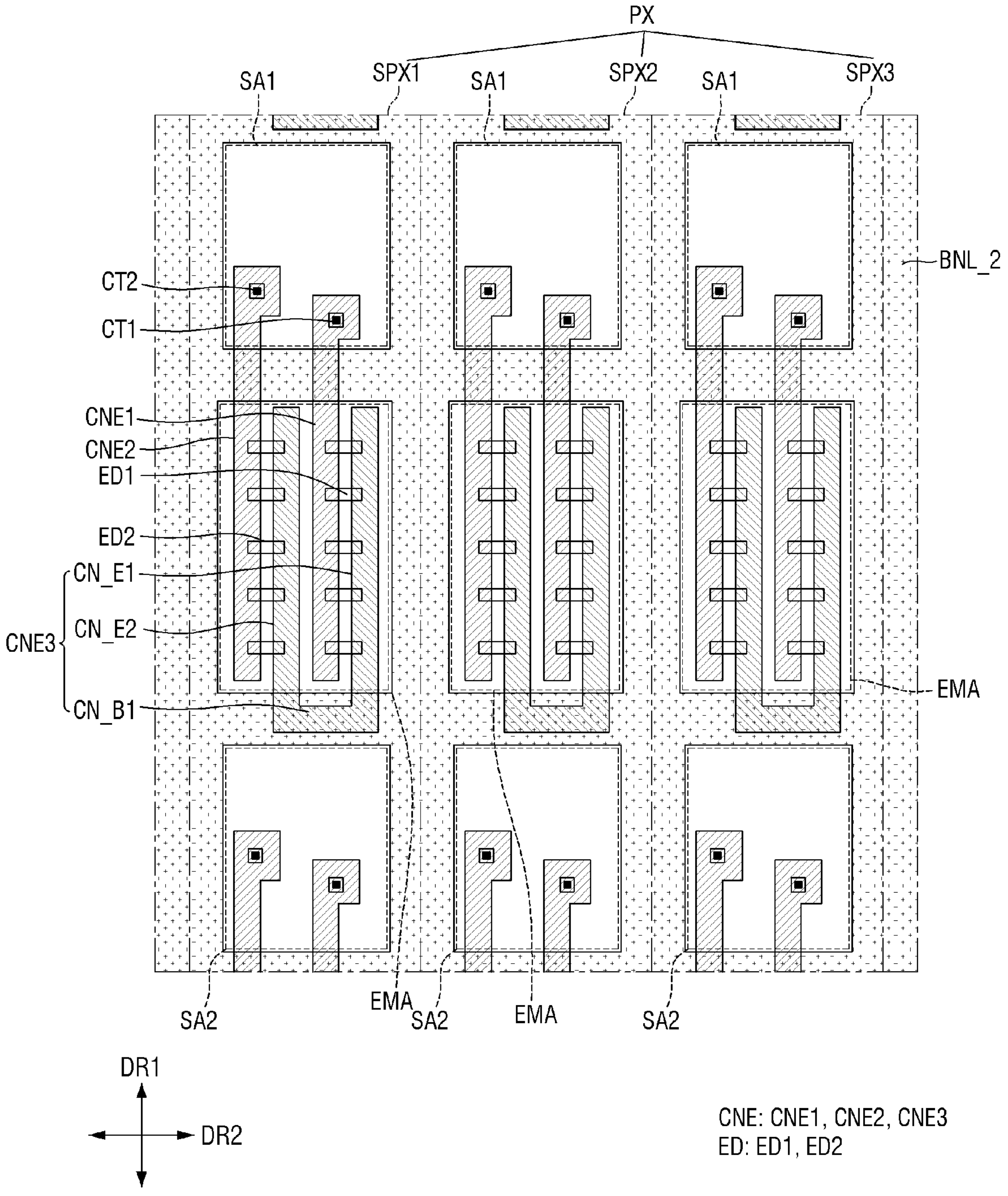
FIG. 29 is a schematic plan view showing an arrangement of a bank layer according to an embodiment.

FIG. 29 is a schematic plan view showing an arrangement of a bank layer according to an embodiment.

The embodiment of FIG. 29 is substantially identical to the embodiment of FIGS. 5 to 8 except that a bank layer BNL_2 is formed only of the second bank portion BNL2 of FIGS. 5 to 8 in a display device; and, therefore, the redundant descriptions will be omitted.

In concluding the detailed description, those skilled in the art will appreciate that many variations and modifications can be made to the disclosed embodiments without substantially departing from the principles of the disclosure. Therefore, the disclosed embodiments are used in a generic and descriptive sense only and not for purposes of limitation.

What is claimed is:

1. A display device comprising:

sub-pixels;

a first electrode disposed in each of the sub-pixels on a substrate and extended in a first direction;

a second electrode spaced apart from the first electrode on the substrate in a second direction intersecting the first direction and extended in the first direction;

a bank layer extended in the first direction and the second direction on the first electrode and the second electrode and surrounding the sub-pixels;

light-emitting elements disposed on the first electrode and the second electrode;

a first connection electrode disposed on the first electrode and extended in the first direction; and a second connection electrode disposed on the second electrode, extended in the first direction and spaced apart from the first connection electrode in the second direction, wherein the bank layer comprises a first bank portion extended in the second direction, and a second bank portion extended in the first direction, the first bank portion comprises a (1-1) bank portion and at least one (1-2) bank portion connected to the (1-1) bank portion in the first direction and having an average height less than an average height of the (1-1) bank portion, the second bank portion comprises a (2-1) bank portion, at least one (2-2) bank portion connected to the (2-1) bank portion in the second direction and having an average height less than an average height of the (2-1) bank portion, and at least one (2-3) bank portion spaced apart from the (2-1) bank portion with the (2-2) bank portion disposed between the (2-1) bank portion and the (2-3) bank portion and having an average height less than an average height of the (2-2) bank portion, a height of a side surface of the (1-1) bank portion facing the (1-2) bank portion is less than a height of a side surface of (1-2) bank portion facing the (1-1) bank portion such that the (1-1) bank portion exposes an upper end of the side surface of the (1-2) bank portion, the (2-1) bank portion exposes an upper end of a side surface of the (2-2) bank portion, and the (2-2) bank portion exposes an upper end of a side surface of the (2-3) bank portion.

2. The display device of claim 1, wherein a length of the upper end of the side surface of the (1-2) bank portion exposed by the (1-1) bank portion is equal to a length of the upper end of the side surface of the (2-3) bank portion exposed by the (2-2) bank portion.

3. The display device of claim 2, wherein a length of the upper end of the side surface of the (2-3) bank portion exposed by the (2-2) bank portion is less than a length of the upper end of the side surface of the (2-2) bank portion exposed by the (2-1) bank portion.

4. The display device of claim 3, wherein the at least one (1-2) bank portion comprises (1-2) bank portions, and the (1-2) bank portions are spaced apart from each other with the (1-1) bank disposed between the (1-2) bank portions.

5. The display device of claim 4, wherein the at least one (2-2) bank portion comprises (2-2) bank portions, and the (2-2) bank portions are spaced apart from each other with the (2-1) bank disposed between the (2-2) bank portions.

6. The display device of claim 5, wherein the at least one (2-3) bank portion comprises (2-3) bank portions, and the (2-3) bank portions are spaced apart from each other with the (2-1) bank portion and the (2-2) bank portions disposed between (2-1) bank portion and the (2-2) bank portions.

7. The display device of claim 3, further comprising:

an insulating layer disposed between the first connection electrode and the bank layer and disposed between the second connection electrode and the bank layer.

8. The display device of claim 7, wherein the insulating layer overlaps the (1-2) bank portion and does not overlap the (1-1) bank portion in a plan view.

9. The display device of claim 8, wherein the insulating layer overlaps the (2-3) bank portion and does not overlap the (2-1) bank portion or the (2-2) bank portion in a plan view.

10. The display device of claim 9, wherein a side surface of the insulating layer is aligned with the side surface of the (1-2) bank portion in a thickness direction.

11. The display device of claim 10, wherein the side surface of the insulating layer is aligned with the side surface of the (2-3) bank portion in the thickness direction.

12. The display device of claim 9, wherein each of the first connection electrode and the second connection electrode overlaps the first bank portion in a plan view.

13. The display device of claim 12, wherein the first connection electrode and the second connection electrode do not overlap the second bank portion in a plan view.

14. A method of fabricating a display device, the method comprising:

forming a first electrode extended in a first direction and a second electrode spaced apart from the first electrode in a second direction intersecting the first direction and extended in the first direction in each of sub-pixels included on a substrate;

forming a bank layer extended in the first direction and the second direction on the first electrode and the second electrode and surrounding the sub-pixels; and forming light-emitting elements disposed on the first electrode and the second electrode, wherein the bank layer comprises a first bank portion extended in the second direction and overlapping a first connection electrode and a second connection electrode in a plan view, and a second bank portion extended in the first direction and not overlapping the first connection electrode and the second connection electrode in a plan view, the first bank portion comprises a (1-1) bank portion and at least one (1-2) bank portion connected to the (1-1) bank portion in the first direction and having an average height less than an average height of the (1-1) bank portion, the second bank portion comprises a (2-1) bank portion, at least one (2-2) bank portion connected to the (2-1) bank portion in the second direction and having an average height less than an average height of the (2-1) bank portion, and at least one (2-3) bank portion spaced apart from the (2-1) bank portion with the (2-2) bank portion disposed between the at least one (2-3) bank portion and the (2-1) bank portion and having an average height less than an average height of the (2-2) bank portion, the (1-1) bank portion exposes an upper end of a side surface of the (1-2) bank portion, the (2-1) bank portion exposes an upper end of a side surface of the (2-2) bank portion, and the (2-2) bank portion exposes an upper end of a side surface of the (2-3) bank portion.

15. The method of claim 14, wherein a length of the upper end of the side surface of the (1-2) bank portion exposed by the (1-1) bank portion is equal to a length of the upper end of the side surface of the (2-3) bank portion exposed by the (2-2) bank portion, and a length of the upper end of the side surface of the (2-3) bank portion exposed by the (2-2) bank portion is less than a length of the upper end of the side surface of the (2-2) bank portion exposed by the (2-1) bank portion.

16. The method of claim 15, wherein the at least one (1-2) bank portion comprises (1-2) bank portions, and the (1-2) bank portions are spaced apart from each other with the (1-1) bank portion disposed between the (1-2) bank portions, and the at least one (2-2) bank portion comprises (2-2) bank portions, and the (2-2) bank portions are spaced apart from each other with the (2-1) bank portion disposed between the (2-2) bank portions.

17. The method of claim 16, wherein the at least one (2-3) bank portion comprises (2-3) bank portions, and the (2-3) bank portions are spaced apart from each other with the (2-1) bank portion and the (2-2) bank portions disposed between the (2-3) bank portions.

18. The method of claim 16, further comprising:

an insulating layer disposed between the first connection electrode and the bank layer and disposed between the second connection electrode and the bank layer.

19. The method of claim 18, wherein the insulating layer overlaps the (1-2) bank portions in a plan view and does not overlap the (1-1) bank portion in a plan view, and wherein the insulating layer overlaps the (2-3) bank portion in a plan view and does not overlap the (2-1) bank portions or the (2-2) bank portions in a plan view.

20. The method of claim 19, wherein a side surface of the insulating layer is aligned with the side surface of the (1-2) bank portion in a thickness direction, the side surface of the insulating layer is aligned with the side surface of the (2-3) bank portion in the thickness direction, the first connection electrode and the second connection electrode overlap the first bank portion in a plan view, and the first connection electrode and the second connection electrode do not overlap the second bank portion in a plan view.

* * * * *